(12) United States Patent
Kofuji

(10) Patent No.: US 7,479,459 B2
(45) Date of Patent: Jan. 20, 2009

(54) SEMICONDUCTOR DEVICE MANUFACTURING METHOD AND SEMICONDUCTOR DEVICE MANUFACTURING APPARATUS

(75) Inventor: Naoyuki Kofuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 489 days.

(21) Appl. No.: 11/242,905

(22) Filed: Oct. 5, 2005

(65) Prior Publication Data

US 2006/0076315 A1 Apr. 13, 2006

(30) Foreign Application Priority Data

Oct. 8, 2004 (JP) .............................. 2004-296247

(51) Int. Cl.
H01L 21/302 (2006.01)
(52) U.S. Cl. ....................................... 438/734; 438/585
(58) Field of Classification Search ................. 438/585, 438/734
See application file for complete search history.

(56) References Cited

U.S. PATENT DOCUMENTS

| 7,045,462 | B2 | 5/2006 | Sakai et al. | |
| 2004/0058533 | A1* | 3/2004 | Sakai et al. | 438/689 |
| 2006/0281325 | A1* | 12/2006 | Chou et al. | 438/734 |

FOREIGN PATENT DOCUMENTS

| JP | 8-125283 A | 5/1996 |
| JP | 9-283585 A | 10/1997 |
| JP | 11-260799 A | 9/1999 |
| JP | 2001-85388 A | 3/2001 |
| JP | 2001-210619 A | 8/2001 |
| JP | 2002-005634 | 1/2002 |
| JP | 2003-229414 A | 8/2003 |
| JP | 2004-119514 | 4/2004 |
| JP | 2004-518272 | 6/2004 |

OTHER PUBLICATIONS

Japanese Office Action, with partial English Translation, issued in Japanese Patent Application JP 2004-296247 dated on Jun. 17, 2008.

* cited by examiner

*Primary Examiner*—Jack Chen
(74) *Attorney, Agent, or Firm*—McDermott Will & Emery LLP

(57) ABSTRACT

A semiconductor device manufacturing method and a semiconductor device manufacturing apparatus which enable to detect an etching end-point with high accuracy are provided. In etching of a lower layer formed on a semiconductor wafer using a mask which comprises a plurality of patterns extending in a predetermined direction (line-and-space patterns) and contains at least one of a metal layer and an electrically-conductive metal compound layer, the surface of the semiconductor wafer is irradiated with inspection light, the etching is performed while monitoring the intensity of the polarized light component perpendicular to the predetermined extending direction of the line-and-space patterns and the etching is terminated at the time the intensity of the polarized light component reaches a reflected light intensity corresponding to a desired remaining thickness of the lower layer.

12 Claims, 22 Drawing Sheets

SEMICONDUCTOR DEVICE MANUFACTURING METHOD AND SEMICONDUCTOR DEVICE MANUFACTURING APPARATUS

TECHNICAL FIELD

The present invention relates to a semiconductor device manufacturing method and a semiconductor device manufacturing apparatus and more particularly to a semiconductor device manufacturing method and a semiconductor device manufacturing apparatus capable of detecting the etching end point during an etching process.

BACKGROUND OF THE INVENTION

Dry-etching processes using plasma have been often employed in semiconductor device manufacturing processes. In conventional dry-etching processes, in many cases, etching is performed until the layer to be etched is completely eliminated. However, in some cases, there is a need for terminating etching at the time the depth of a trench being formed by etching reaches a desired depth or at the time the remaining thickness of a layer being etched reaches a desired thickness. In such cases, it is necessary to detect the etching end point with higher accuracy in comparison with usual dry-etching processes.

As a method for accurately detecting an etching end point, there has been known a method which irradiates the surface of a semiconductor wafer with light during etching and detects the etching end point on the basis of the intensity of reflected light from the surface, as disclosed in Japanese Patent Application Laid-Open No. 2001-210619.

The method disclosed in Japanese Patent Application Laid-Open No. 2001-210619 employs, during etching for forming trenches for isolation in a silicon substrate, light containing a polarized light component parallel to the extending direction of parallel mask patterns for the formation of trenches (line-and-space patterns), to thereby improve the accuracy of the end-point detection. Further, there have been suggested various types of etching end-point detecting methods as disclosed in Japanese Patent Application Laid-Open Nos. 8-125283, 9-283585, 11-260799, 2003-229414, 2001-85388 and the like.

SUMMARY OF THE INVENTION

However, the utilization of light containing a polarized light component parallel to the direction of extension of line-and-space patterns as in the etching end-point detecting method of the aforementioned Japanese Patent Application Laid-Open No. 2001-210619 has rather degraded the detection accuracy, in some cases.

Therefore, it is an object of the invention to provide a semiconductor device manufacturing method capable of detecting an etching end-point with high accuracy.

Further, it is another object of the present invention to provide a semiconductor device manufacturing apparatus capable of detecting an etching end-point with high accuracy.

The present inventors have proven the following facts, from earnest studies for improving the accuracy of etching end-point detections. That is, in the case where mask layer forms line-and-space patterns and the regions covered with the mask layer contains an electrically-conductive layer having a significantly low electrical resistance such as a metal layer and an electrically-conductive metal compound layer, even if the surface of the semiconductor wafer is irradiated with light, reflected light consisting of polarized light components parallel to the direction of extension of line-and-space patterns of the mask layer is hardly modulated in terms of intensity with respect to the amount of etching. Further, the present inventors have proven the following facts, from further studies about such a phenomenon. That is, the aforementioned phenomenon is caused by induced currents in the metal layer or the electrically-conductive metal compound layer existing in the object regions of etching, such induced currents are generated by the energy of irradiated light.

The present invention was made in view of the aforementioned technical findings and the above and other objects of the present invention can be accomplished by a semiconductor device manufacturing method for etching a lower layer corresponding to between plural patterns constituting a mask layer on a semiconductor wafer including the lower layer and the plural patterns formed on the lower layer to extend in a predetermined direction and contain at least one of a metal and an electrically-conductive metal compound, comprising the steps of irradiating the semiconductor wafer with inspection light, and determining an end-point of the etching, on the basis of intensity of a polarized light component perpendicular to the predetermined direction contained in reflected light of the inspection light which is reflected from the semiconductor wafer.

Further, a semiconductor device manufacturing apparatus according to the present invention is a semiconductor device manufacturing apparatus for applying plasma processing to a surface of a semiconductor wafer comprising a stage for mounting a semiconductor wafer thereon, a light source for generating inspection light which irradiates the stage, a measuring unit for receiving reflected light from the semiconductor wafer, and a polarizing filter placed at least one of between the light source and the stage and between the stage and the measuring unit, wherein when a semiconductor wafer, which includes a mask layer comprising plural patterns extending in a predetermined direction and containing at least one of a metal layer and an electrically-conductive metal compound layer, is mounted on said stage, at least one of said stage and said polarizing filter can be adjusted such that a direction of polarization of light which has passed through said polarizing filter becomes perpendicular to the predetermined direction during etching a lower layer under portions corresponding to between the plural patterns of the mask layer.

The present invention utilizes, in detecting the etching end-point, polarized light perpendicular to the direction of extension of the plural patterns of the mask layer containing at least one of a metal and an electrically-conductive metal compound, thus significantly reducing the induced current flowing through the plural patterns of the mask layer. This can effectively suppress the electromagnetic-wave shielding effect and the current loss due to induced currents and, therefore, the reflected light intensity is largely changed in accordance with the amount of etching. Consequently, the present invention enables detections of etching end-points with high accuracy. Further, the effects of the present invention will be more prominent when the electrically-conductive layer contained in the mask layer has a lower electrical resistance. Therefore, the present invention is particularly effective when the electrically-conductive layer contained in the mask layer is made of metal.

BRIEF DESCRIPTION OF THE DRAWINGS

The above and other objects, features and advantages of the present invention will become more apparent by reference to the following detailed description of the invention taken in conjunction with the accompanying drawings, wherein.

DETAILED DESCRIPTION OF THE EMBODIMENTS

First, the principle of the present invention will be described prior to detailed description of a semiconductor device manufacturing method according to a preferred embodiment of the present invention.

Figure 1:
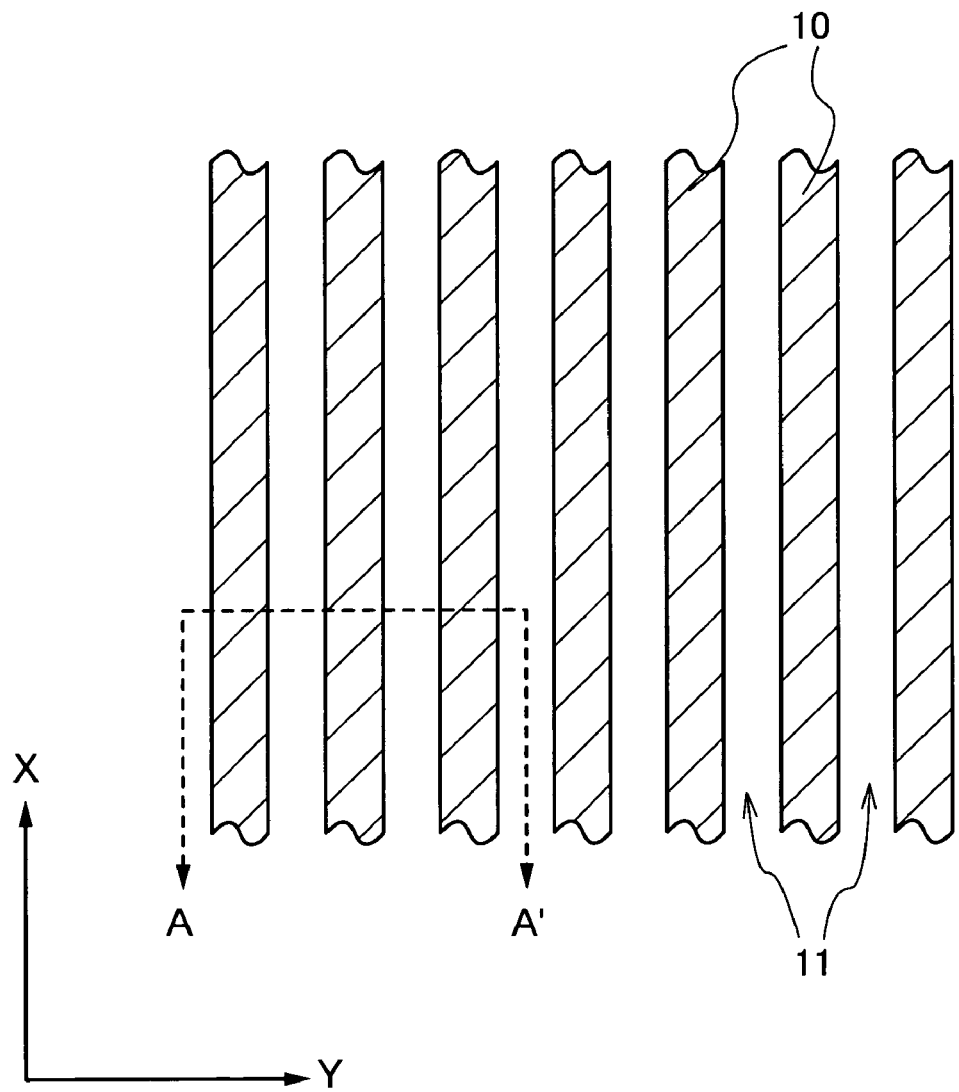
FIG. 1 is a schematic plan view of a semiconductor wafer 1 having a plurality of mask patterns 10 formed to extend in one direction.
Figure 2:
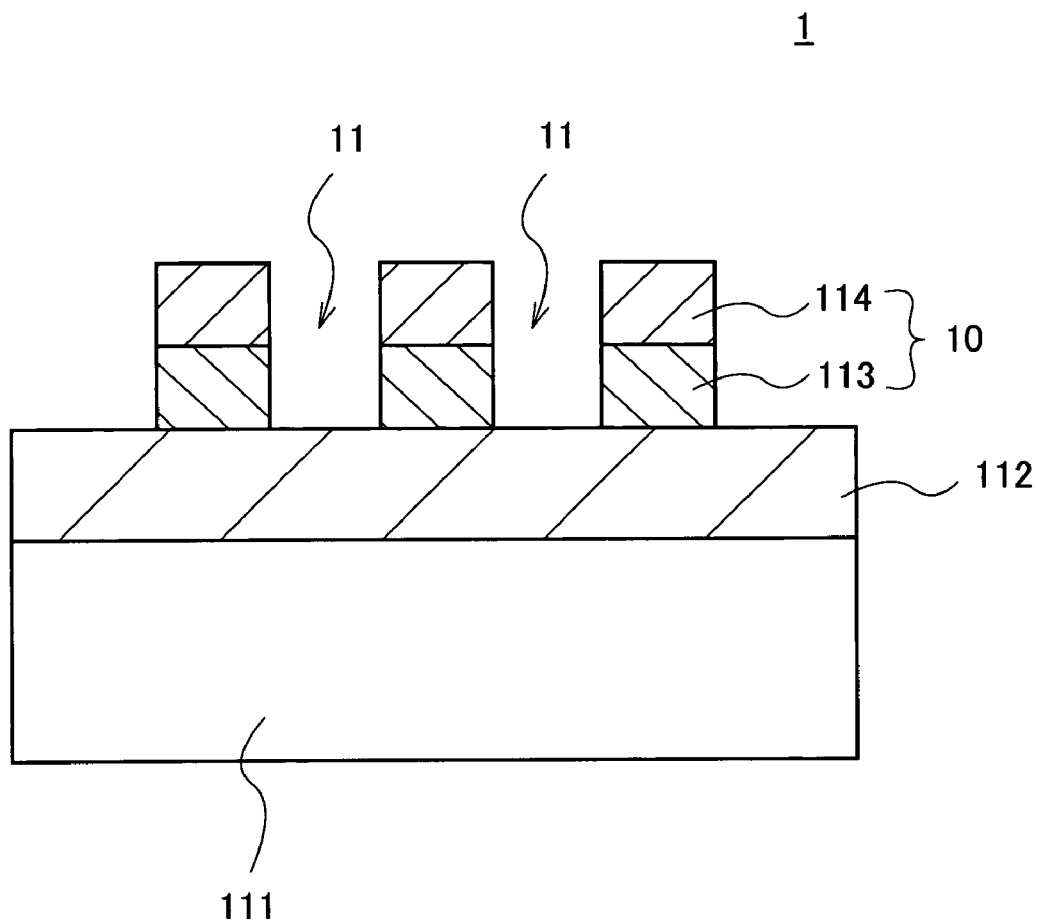
FIG. 2 is a schematic cross-sectional view of the semiconductor wafer 1 along the line A-A' in FIG. 1.

FIG. 1 is a schematic plan view of a semiconductor wafer 1 having a plurality of mask patterns 10 formed to extend in one direction, and FIG. 2 is a schematic cross-sectional view of the semiconductor wafer 1 along the line A-A' in FIG. 1.

As shown in FIG. 1, the plural mask patterns 10 are provided in parallel with one another along a direction X so that the mask patterns 10 and the regions 11 existing therebetween form so-called "line-and-space patterns".

As shown in FIG. 2, the mask patterns 10 are constituted by an electrically-conductive layer 113 and a mask 114 which are laminated in the mentioned order, wherein the electrically-conductive layer 113 includes at least one of a metal and an electrically-conductive metal compound, and a semiconductor substrate 111 and a layer to be etched (lower layer) 112 are provided under the mask patterns 10. The mask patterns 10 are formed to partially cover the lower layer 112. In this state, by applying the semiconductor wafer 1 to plasma etching, it is possible to selectively etch the portions of the lower layer 112 which are exposed at the regions 11.

Figure 3:
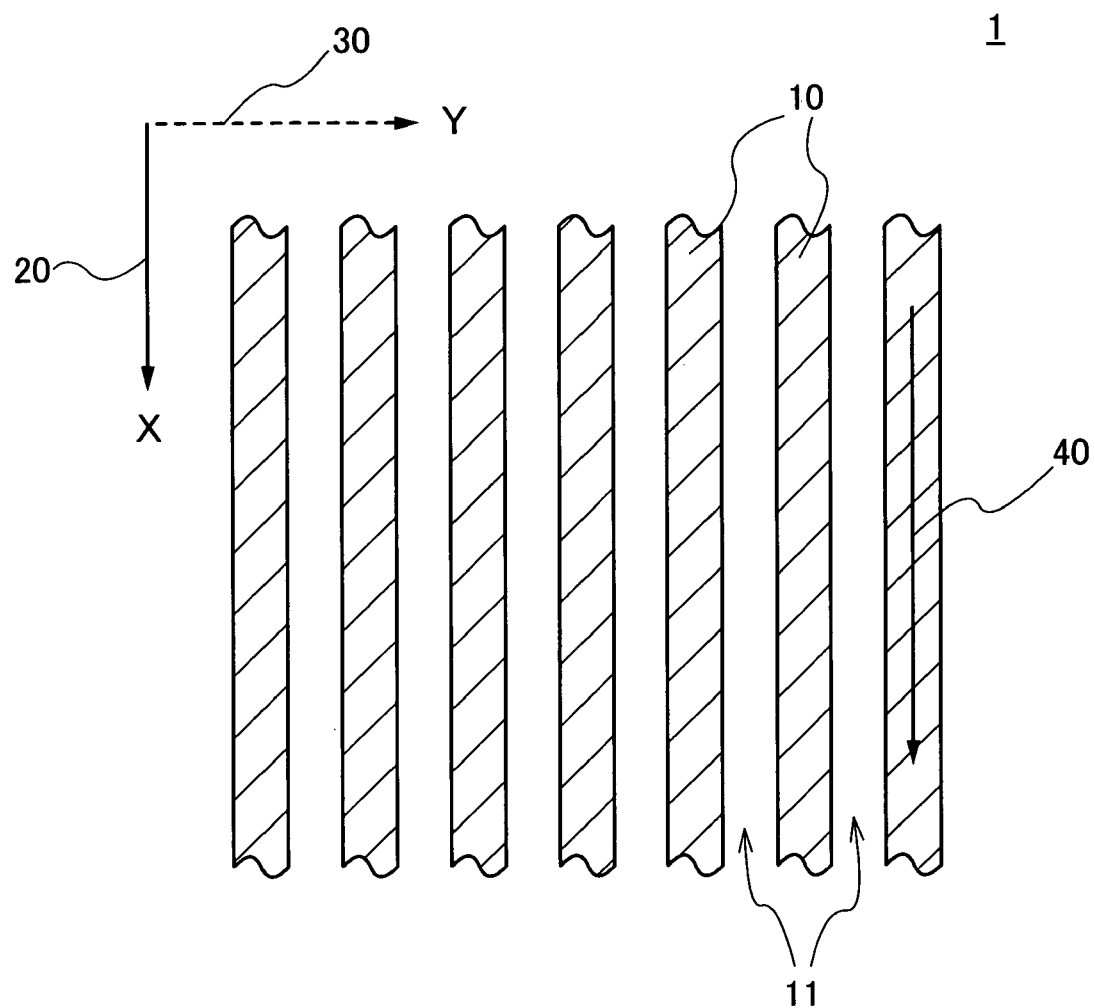
FIG. 3 shows the direction of electric field, the direction of magnetic field and the direction of induced current when the surface of the semiconductor wafer 1 is irradiated with polarized light in the direction X which is the extending direction of the mask patterns 10.
Figure 4:
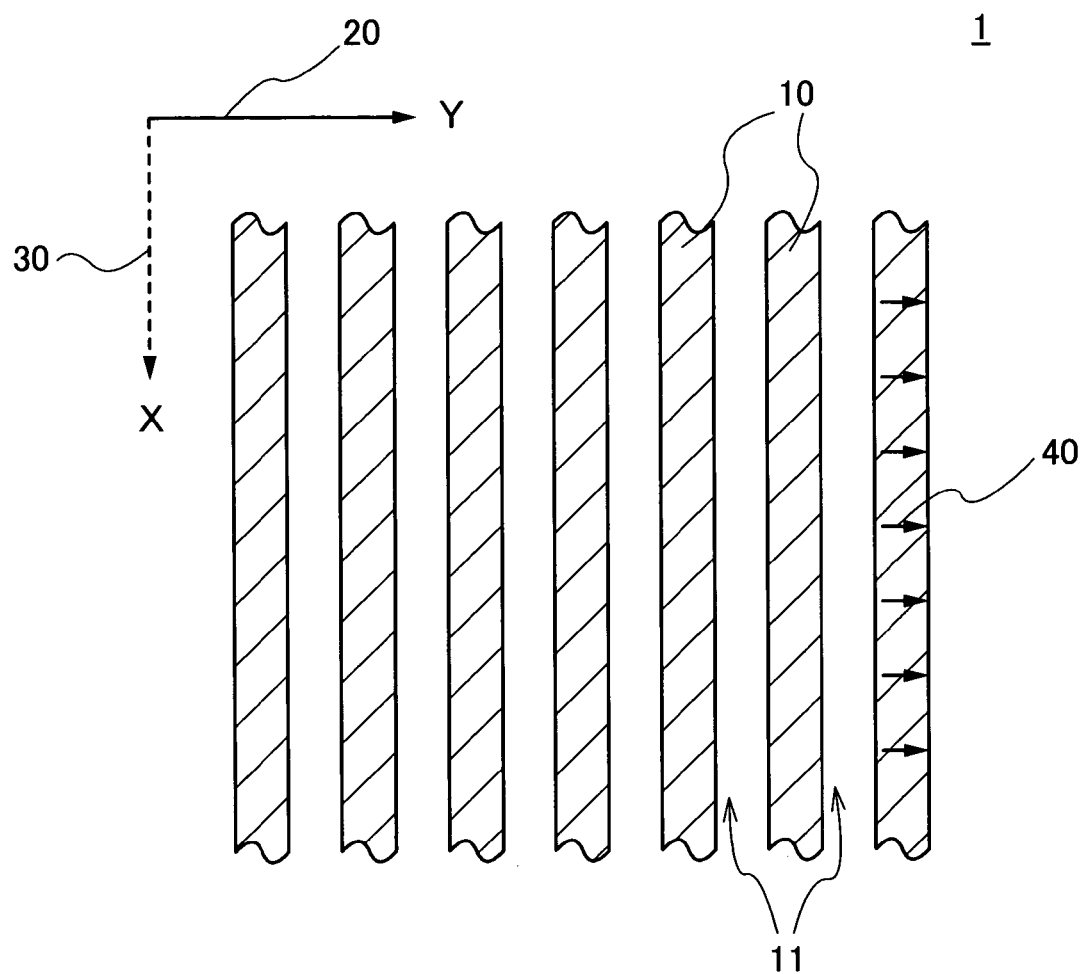
FIG. 4 shows the direction of electric field, the direction of magnetic field and the direction of induced current when the surface of the semiconductor wafer 1 is irradiated with polarized light in the direction Y which is perpendicular to the extending direction of the mask patterns 10.

FIG. 3 shows the direction of electric field, the direction of magnetic field and the direction of induced current when the surface of the semiconductor wafer 1 is irradiated with polarized light in the direction X which is the extending direction of the mask patterns 10. FIG. 4 shows the direction of electric field, the direction of magnetic field and the direction of induced current when the surface of the semiconductor wafer 1 is irradiated with polarized light in the direction Y which is perpendicular to the extending direction of the mask patterns 10.

When the surface of the semiconductor wafer 1 is irradiated with polarized light parallel to the extending direction of the mask patterns 10 (the direction X), an electric field 20 is generated in the direction X which is the longitudinal direction of the mask patterns 10 and a magnetic field 30 is generated in the direction Y perpendicular thereto, as shown in FIG. 3. On the other hand, the mask patterns 10 include at least one of a metal and an electrically-conductive metal compound, and these materials have significantly high electrical conductivities unlike semiconductors and insulators, thus generating an induced current 40 along the electric field 20 in the electrically-conductive layer 113. Accordingly, the induced current 40 flows in the direction X in the electrically-conductive layer 113. Since the direction X is the longitudinal direction of the mask patterns 10, the amount of the induced current 40 is relatively large. Consequently, the induced current 40 offers a significant electromagnetic-wave shielding effect, and the current loss within the mask patterns 10 becomes large. This hinders the polarized light from being introduced into the regions 11 between the mask patterns 10. Since the lower the resistance of the electrically-conductive layer 113, the greater the amount of the induced current 40, the aforementioned problem will be prominent in the case where the electrically-conductive layer 113 is made of metal.

On the other hand, when the surface of the semiconductor wafer 1 is irradiated with polarized light perpendicular to the direction of extension of the mask patterns 10 (the direction X), a magnetic field 30 is generated in the direction X which is the longitudinal direction of the mask patterns 10 and an electric field 20 is generated in the direction Y perpendicular thereto, as shown in FIG. 4. Consequently, an induced current 40 flows in the direction Y in the electrically-conductive layer 113. However, since the direction Y is the widthwise direction of the mask patterns 10 and thus the amount of the induced current 40 is significantly small, the induced current 40 offers a significantly small electromagnetic-wave shielding effect, and the current loss in the mask patterns 10 is significantly small. Therefore, polarized light in the direction perpendicular to the mask patterns 10 (the direction Y) can easily reach the bottoms of the regions 11 between the mask patterns 10.

Figure 5:
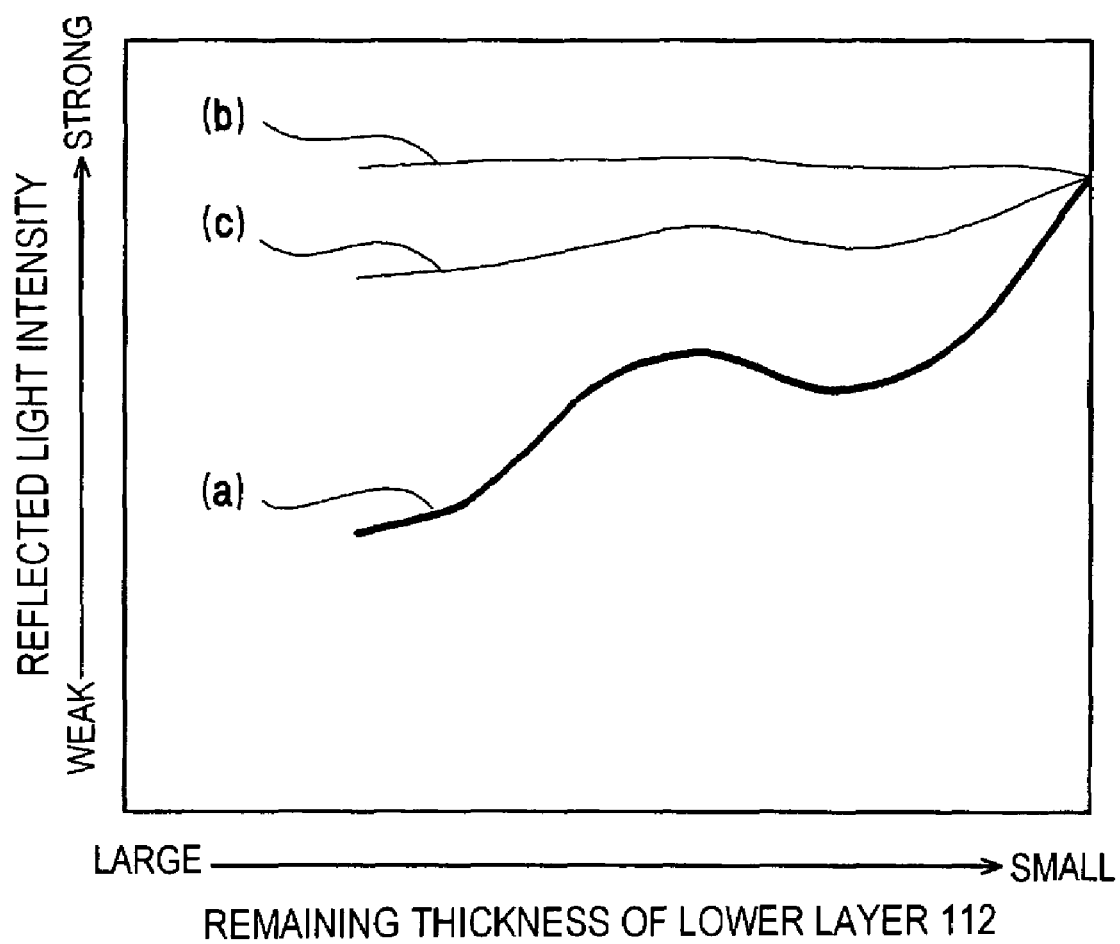
FIG. 5 is graphs showing the relationship between the remaining thickness of the lower layer 112 and the reflected light intensity when etching is applied to the lower layer 112

FIG. 5 is graphs showing the relationship between the remaining thickness of the lower layer 112 and the reflected light intensity when etching is applied to the lower layer 112 on the semiconductor wafer 1 shown in FIG. 1 and FIG. 2, wherein (a) shows the result of measurements of the intensity of the polarized light component in the direction Y perpendicular to the direction of extension of the mask patterns 10 out of the polarized light components contained in the reflected light, (b) shows the result of measurements of the intensity of the polarized light component in the direction X parallel to the direction of extension of the mask patterns 10 out of the polarized light components contained in the reflected light and (c) shows the result of measurements of the intensity of the total reflected light (unpolarized light).

As can be seen from FIG. 5, the intensity (b) of the polarized light component in the direction X is hardly changed with respect to the remaining thickness of the lower layer 112, while the intensity (a) of the polarized light component in the direction Y is periodically changed due to the interference with the remaining thickness of the lower layer 112. The intensity (c) of the total reflected light is the average of (a) and (b) and thus changes to some degree in accordance with the remaining thickness of the lower layer 112, but the change is significantly small.

The present invention utilizes this phenomenon and monitors, during etching, the intensity of polarized light component perpendicular to the mask patterns (corresponding to (a) in FIG. 5) out of reflected light from the surface of the semiconductor wafer, in the case of using line-and-space shaped mask patterns including at least one of a metal layer and an electrically-conductive metal compound layer for etching an underlying layer. As previously described, the polarized light component perpendicular to the mask patterns is significantly modulated in terms of intensity with respect to the amount of etching, thus enabling accurate and easy determination of the current amount of etching (the remaining layer thickness). Consequently, it becomes possible to detect the etching end-point with higher accuracy in comparison with conventional methods. In an actual manufacturing process, an accurate remaining layer thickness can be obtained by measuring in advance the relationship between the remaining layer thickness and the reflected light intensity and terminating etching at the time the reflected light intensity reaches an intensity corresponding to a desired remaining layer thickness.

Next, there will be described a semiconductor device manufacturing apparatus according to a preferred embodiment of the present invention.

Figure 6:
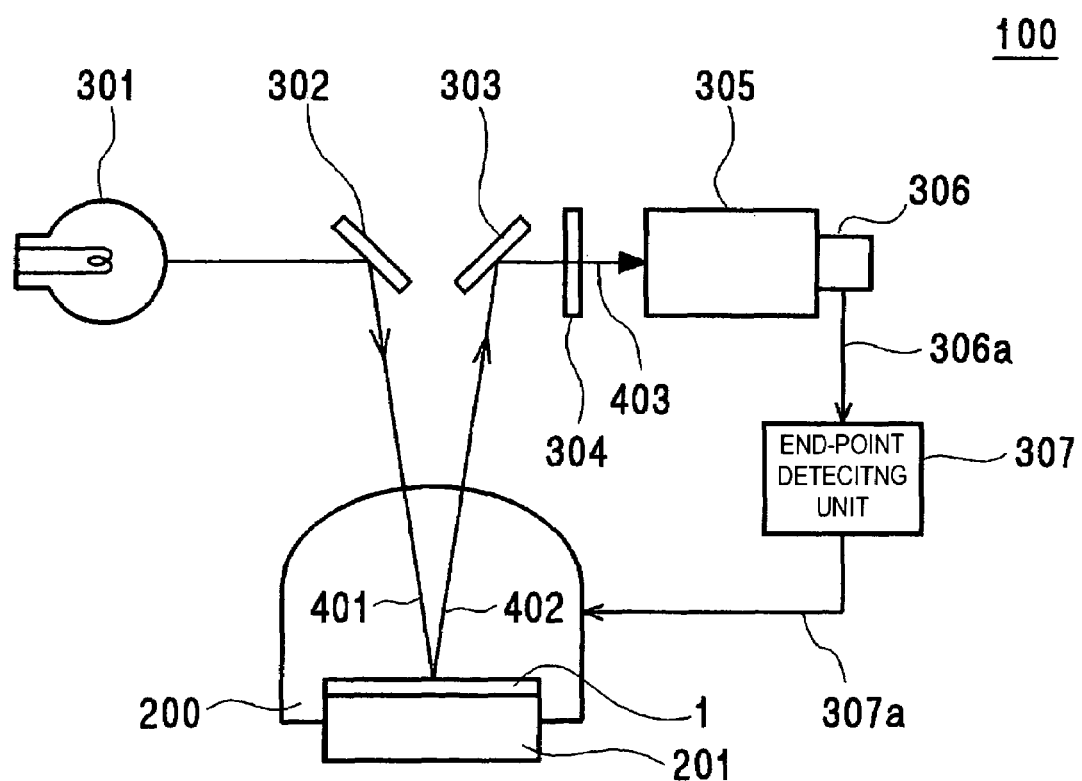
FIG. 6 is a schematic block diagram of a semiconductor device manufacturing apparatus 100 according to a preferred embodiment of the present invention on the semiconductor wafer 1 shown in FIG. 1 and FIG. 2.

FIG. 6 is a schematic block diagram of a semiconductor device manufacturing apparatus 100 according to a preferred embodiment of the present invention.

The semiconductor device manufacturing apparatus 100 according to the present embodiment includes a plasma processing unit 200 including a stage 201 for mounting a semiconductor wafer 1 thereon, a light source 301, a first reflector 302 which reflects inspection light 401 generated from the light source 301 toward the surface of the semiconductor wafer 1 on the stage 201, a second reflector 303 which reflects reflected light 402 from the semiconductor wafer 1, a polarizing filter 304 which passes therethrough a polarized light component in one direction out of the reflected light 402 reflected by the second reflector 303, a spectroscope 305 which receives the polarized light 403 which has passed through the polarizing filter 304 and extracts a desired wavelength, a measuring unit 306 for measuring the intensity of the polarized light 403 extracted by the spectroscope 305, and an end-point detecting unit 307 for detecting the etching end-point on the basis of the measurement result 306a from the measuring unit 306.

There has been prestored, in the end-point detecting unit 307, the relationship between the remaining layer thickness and the reflected light intensity as shown in FIG. 5, and the end-point detecting unit 307 monitors the measurement results 306a sent from the measuring unit 306 and supplies control signals 307a to the plasma processing unit 200 so as to cause it to terminate etching when the reflected light intensity reaches an intensity corresponding to a desired remaining layer thickness.

Figure 7:
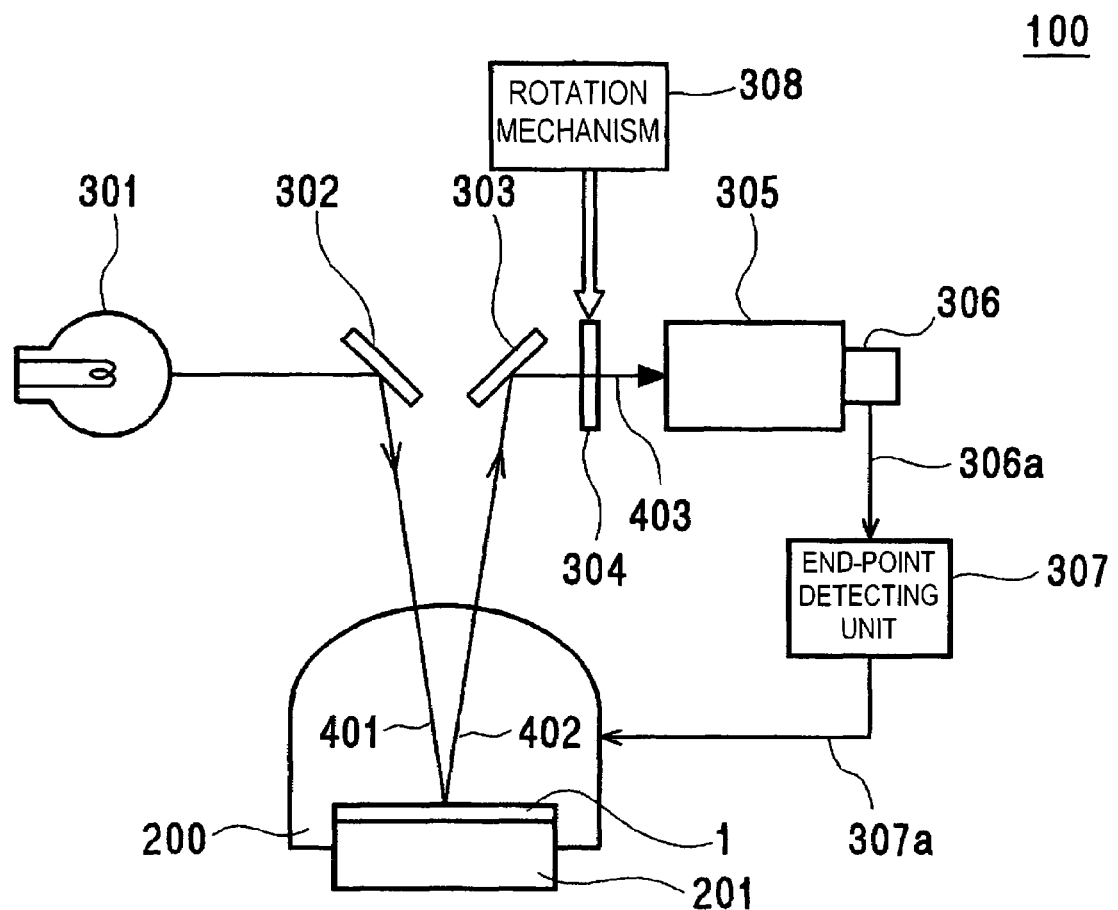
FIG. 7 is a schematic block diagram of a semiconductor device manufacturing apparatus 100 in the case of providing a rotation mechanism 308.
Figure 8:
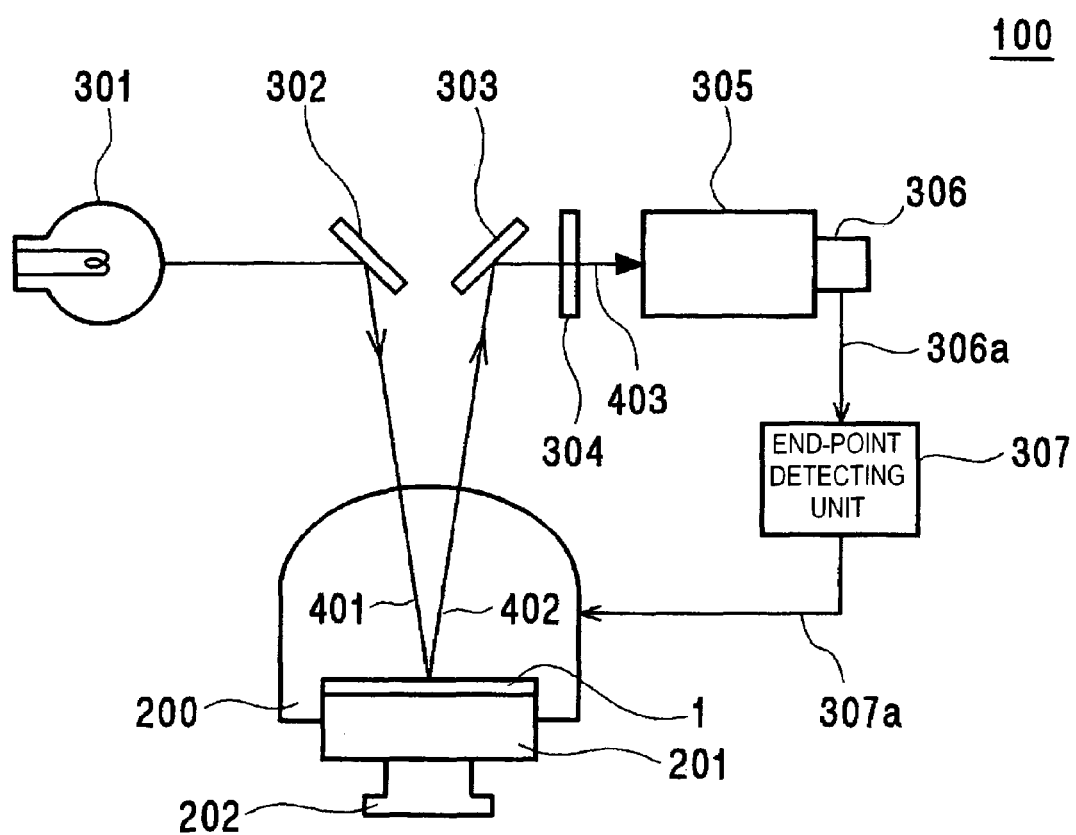
FIG. 8 is a schematic block diagram of a semiconductor device manufacturing apparatus 100 in the case of providing a rotation mechanism 202.

In the case of applying plasma etching to an underlying layer using line-and-space shaped mask patterns including at least one of a metal layer and an electrically-conductive metal compound layer with the use of the semiconductor device manufacturing apparatus 100 having the aforementioned structure, it is possible to determine the etching end-point with high accuracy by adjusting the angle of the polarizing filter 304 or the stage 201 such that the polarized light component perpendicular to the mask patterns, out of the reflected light 402 from the semiconductor wafer surface, is incident on the spectroscope 305. In order to adjust the angles of the polarizing filter 304 and the stage 201, there may be provided a rotation mechanism 308 for rotating the polarizing filter 304 in circumferential direction about an optical axis as shown in FIG. 7 or a rotation mechanism 202 for rotating the stage 201 as shown in FIG. 8.

However, instead of providing the rotation mechanism 308 or 202, the angle of the semiconductor wafer 1 can be adjusted using the orientation flat thereof when mounting the semiconductor wafer 1 on the stage 201, so that the polarized light component perpendicular to the mask patterns is incident on the spectroscope 305.

By providing such the rotation mechanism 308 or 202, the orientation of the polarized light 403 incident to the spectroscope 305 can be changed depending on the object to be processed. Specifically, when the semiconductor wafer 1 mounted on the stage 201 includes plural mask patterns containing at least one of a metal layer and an electrically-conductive metal compound layer which are formed on the surface thereof to extend in one direction, the angle of the polarizing filter 304 can be adjusted through the rotation mechanism 308 (or the angle of the stage 201 can be adjusted through the rotation mechanism 202) such that the polarized light component perpendicular to the mask patterns is incident on the spectroscope 305. On the contrary, when the plural mask patterns formed on the surface of the semiconductor wafer 1 do not contain any of a metal layer and an electrically-conductive metal compound layer, the angle of the polarizing filter 304 can be adjusted through the rotation mechanism 308 (or the angle of the stage 201 can be adjusted through the rotation mechanism 202) such that the polarized light component parallel to the direction of extension of patterns is incident on the spectroscope 305. This is based on the fact that, when the mask patterns do not contain any of a metal layer and an electrically-conductive metal compound layer, the intensity of the polarized light component parallel to the direction of extension of the mask patterns is changed more largely with respect to the amount of etching. This enables detection of end-point with high accuracy regardless of whether or not the mask patterns contain a metal layer or an electrically-conductive metal compound layer.

Figure 9:
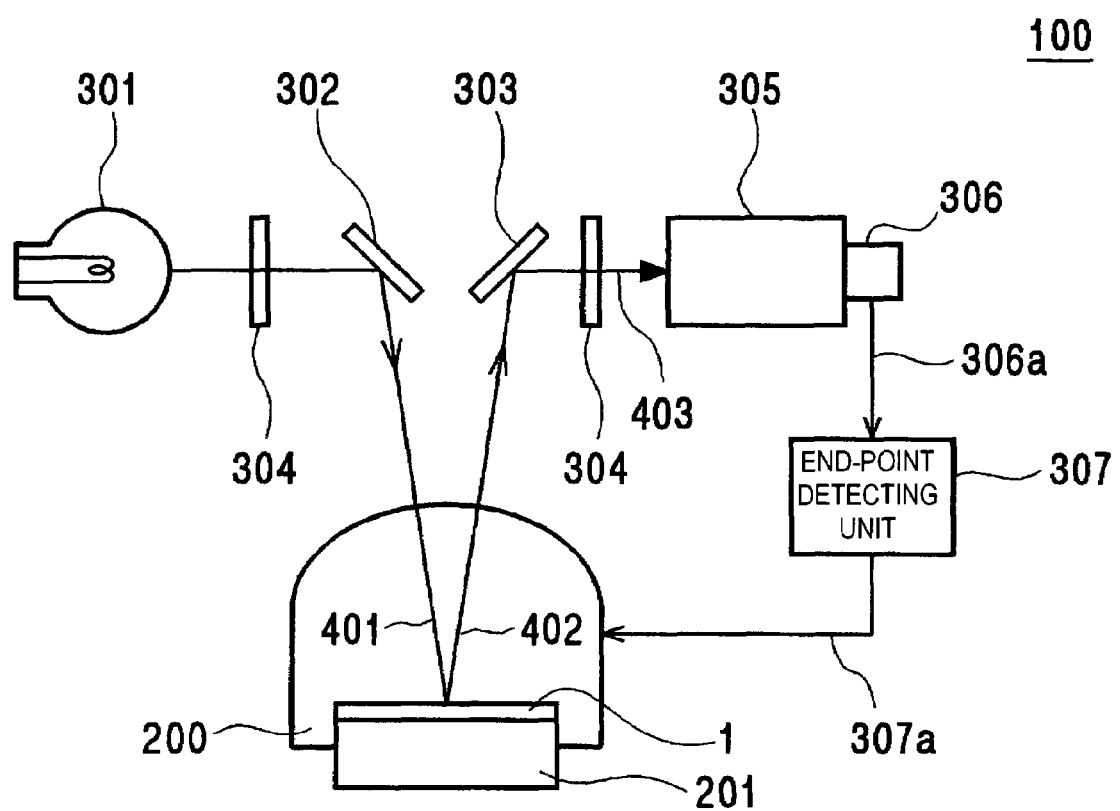
FIG. 9 is a schematic block diagram of the semiconductor device manufacturing apparatus 100 in the case of providing a polarizing filter 304 between a light source 301 and a reflector 302 and between a reflector 303 and a spectroscope 305.
Figure 10:
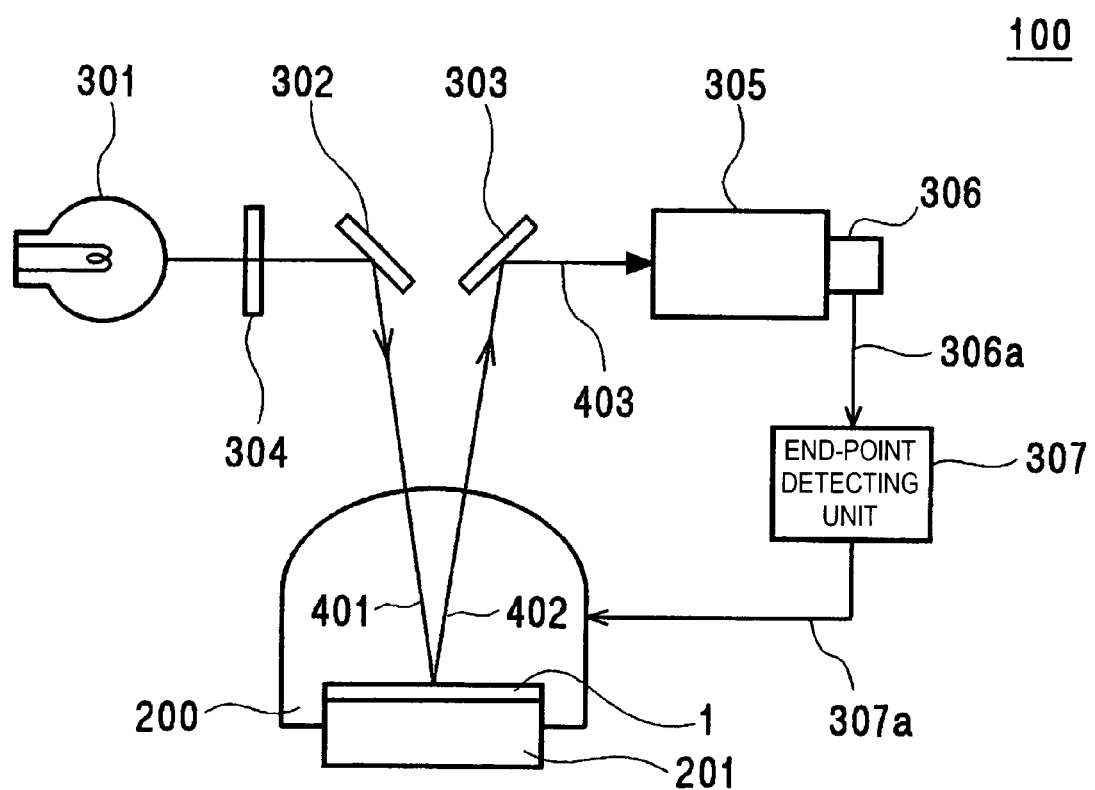
FIG. 10 is a schematic block diagram of the semiconductor device manufacturing apparatus 100 in the case of providing a polarizing filter 304 between a light source 301 and a reflector 302.

In the present embodiment, since the polarizing filter 304 is placed between the reflector 303 and the spectroscope 305, it is possible to efficiently eliminate light generated from plasma, thus reducing the noise introduced to the spectroscope 305 and enabling measurements with high S/N ratios. Also, in order to further increase the S/N ratio, polarizing filters 304 may be placed between the light source 301 and the reflector 302 and between the reflector 303 and the spectroscope 305, as shown in FIG. 9. Further, the polarizing filter 304 may be placed only between the light source 301 and the reflector 302, as shown in FIG. 10. Also, instead of using the polarizing filter 304, the light source 301 itself may cause polarization or the measuring unit 306 may measure only polarized light in one direction. Specifically, it is possible to utilize any means which enable selective measurements of the intensity of the polarized light component perpendicular to the direction of extension of mask patterns containing at least one of a metal layer and an electrically-conductive metal compound layer.

Hereinafter, a semiconductor device manufacturing method according to a preferred embodiment of the present invention will be described in detail by exemplifying the process for formation of a DRAM (Dynamic Random-Access Memory).

FIGS. 11 to 16 and FIGS. 19 to 22 are process drawings showing a semiconductor device manufacturing method according to a preferred embodiment of the present invention, wherein there are schematically shown partial cross-sectional areas of a memory-cell region A and peripheral-circuit regions B and C of a DRAM on a semiconductor wafer 500. In the memory-cell region A, gate electrodes including an N-type polycrystalline silicon layer (hereinafter, referred to as "N-type gates") are densely and regularly formed. In the peripheral-circuit region B and the peripheral-circuit region C, N-type gates and gate electrodes including a P-type polycrystalline silicon layer (hereinafter, referred to as "P-type gates") are respectively formed such that they are separated from the other gate electrodes (not shown). According to the present embodiment, the N-type electrodes and the P-type electrodes are formed to have a so-called polymetal structure constituted by a polycrystalline silicon layer and a metal layer laminated thereon. Hereinafter, the process will be described in order.

Figure 11:
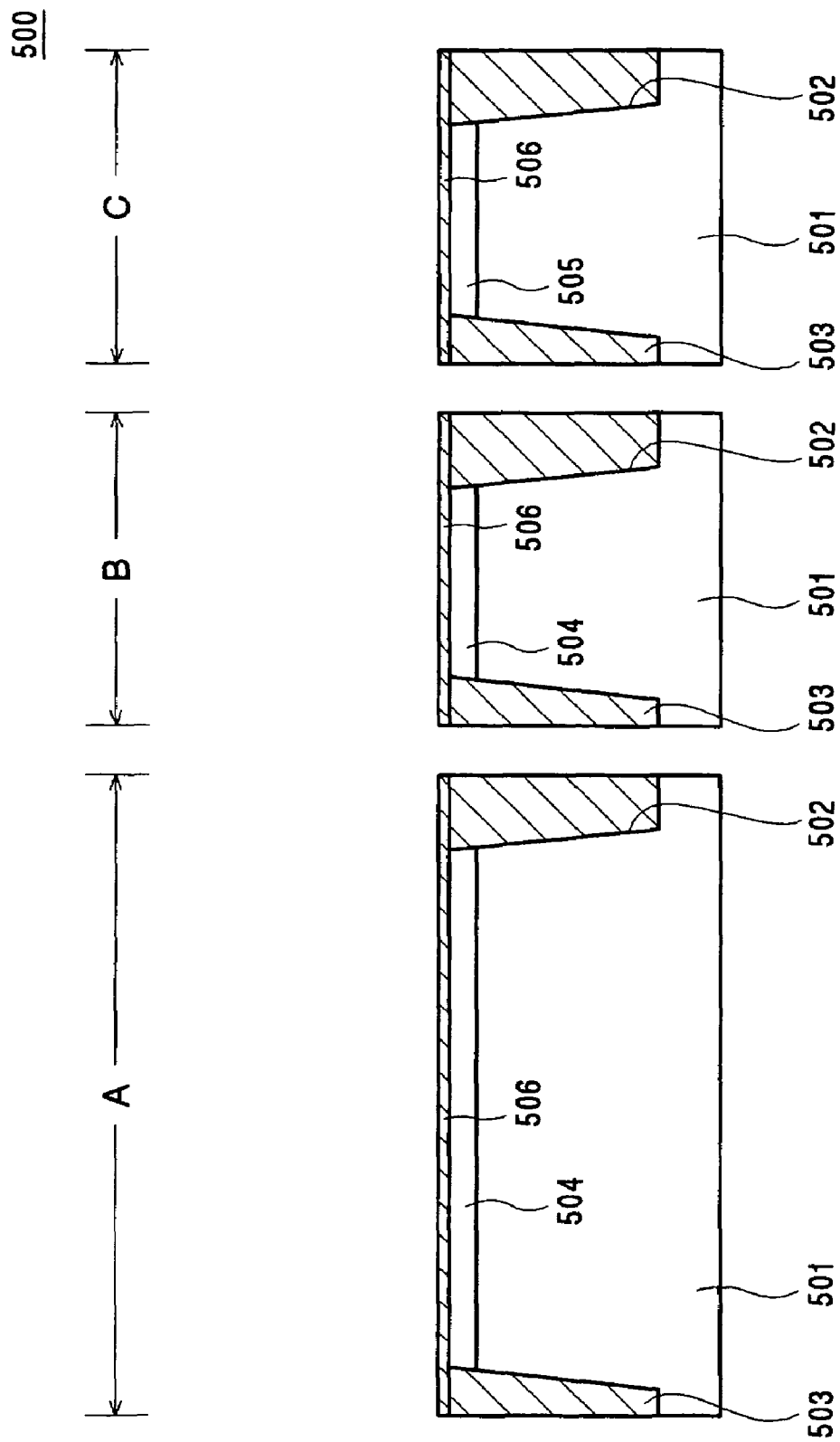
FIG. 11 is a partial cross-sectional view showing one process (from forming of trenches 502 to forming of the gate oxide layer 506) of a semiconductor device manufacturing method according to a preferred embodiment of the present invention.

First, as shown in FIG. 11, a plurality of trenches 502 having a depth of about 250 nm for STI (Shallow Trench Isolation) are formed in a silicon substrate 501. Then, a silicon oxide layer 503 is embedded in the trenches 502 by an HDP-CVD (High-Density Plasma-Chemical Vapor Deposition) method, and thereafter the silicon oxide layer 503 is flattened by CMP (Chemical Mechanical Polishing). Subsequently, boron (B) ions are implanted into the regions A and B to selectively form P-type channel regions 504, and arsenic (As) ions are implanted into the region C to selectively form an N-type channel region 505. Then, a gate oxide layer 506 with a thickness of about 3 nm is formed by thermal oxidation.

Figure 12:
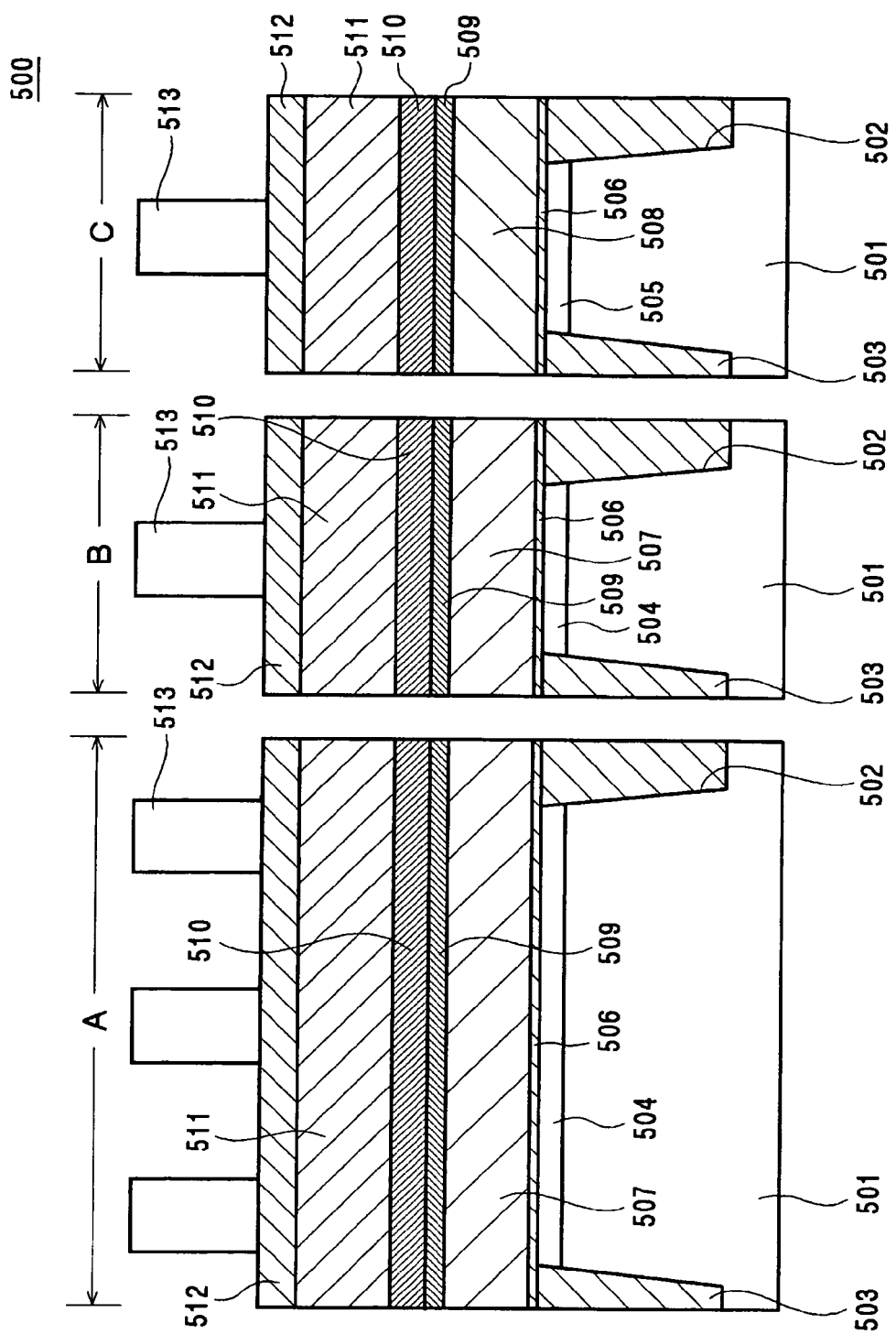
FIG. 12 is a partial cross-sectional view showing one process (from forming of polycrystalline silicon layers 507 and 508 to forming of the resist patterns 513) of the semiconductor device manufacturing method according to the preferred embodiment of the present invention.
Figure 13:
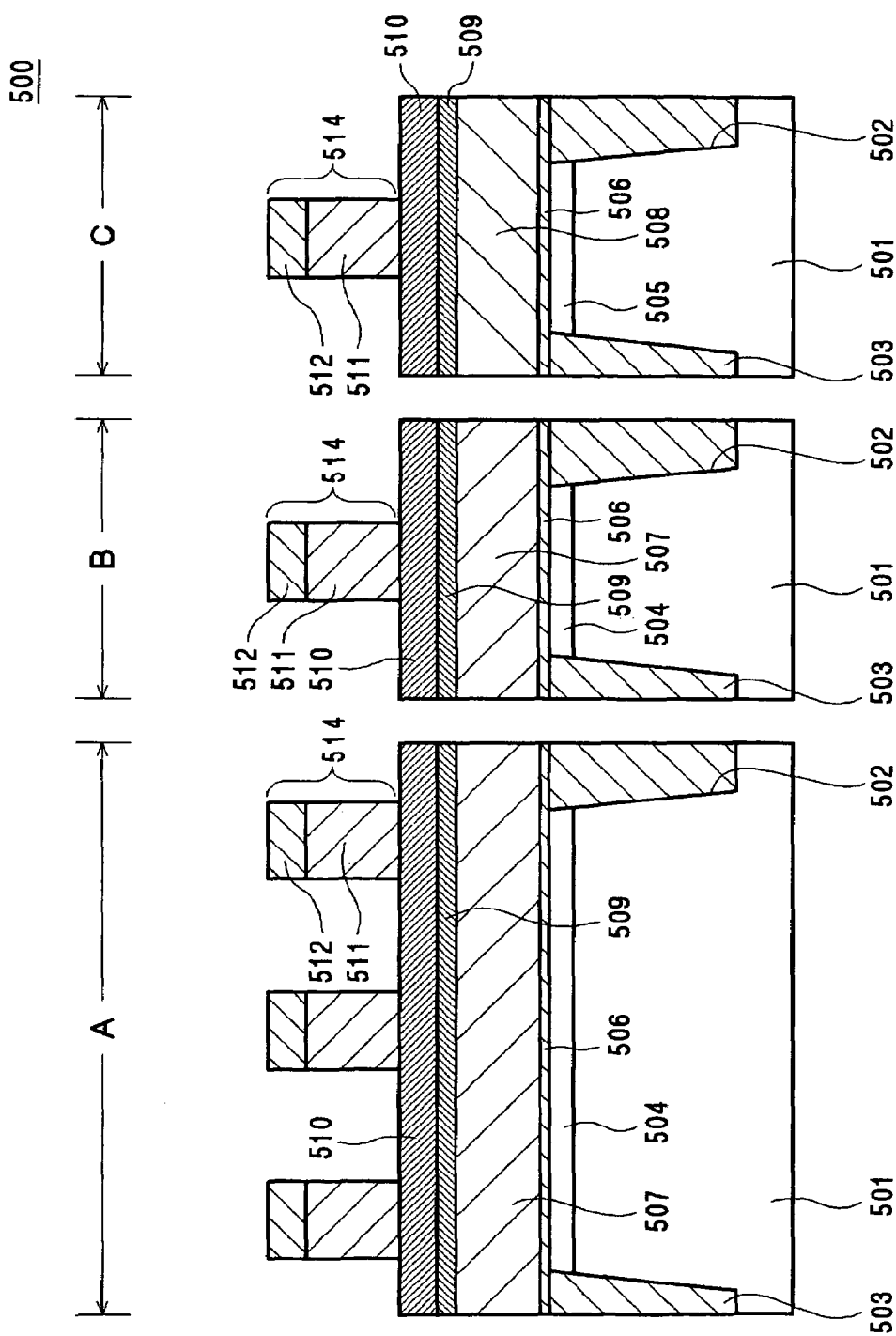
FIG. 13 is a partial cross-sectional view showing one process (forming of mask patterns 514) of the semiconductor device manufacturing method according to the preferred embodiment of the present invention.

Subsequently, as shown in FIG. 12, an N-type polycrystalline silicon layer 507 having a thickness of about 100 nm is formed over the regions A and B and a P-type polycrystalline silicon layer 508 having a thickness of about 100 nm is formed over the region C, respectively. A tungsten nitride (WN) layer 509 with a thickness of about 10 nm, a tungsten (W) layer 510 with a thickness of about 60 nm, a silicon nitride layer 511 with a thickness of about 140 nm and a silicon oxide layer 512 with a thickness of about 80 nm are laminated on the N-type polycrystalline silicon layer 507 and the P-type polycrystalline silicon layer 508. Further, a photo resist is formed on the silicon oxide layer 512 and then it is patterned into resist patterns 513. Then, the silicon oxide layer 512 and the silicon nitride layer 511 are etched by using mixed gas consisting of CF4, CHF3, Ar and O2 and using the resist patterns 513 as masks, with a magnetron-RIE (Reactive Ion Etching) type plasma etching apparatus. Subsequently, the resist patterns 513 are removed. Thus, as shown in FIG. 13, the formation of mask patterns 514 having a laminated-layer structure constituted by the silicon oxide layer 512 and the silicon nitride layer 511 has been completed.

Figure 14:
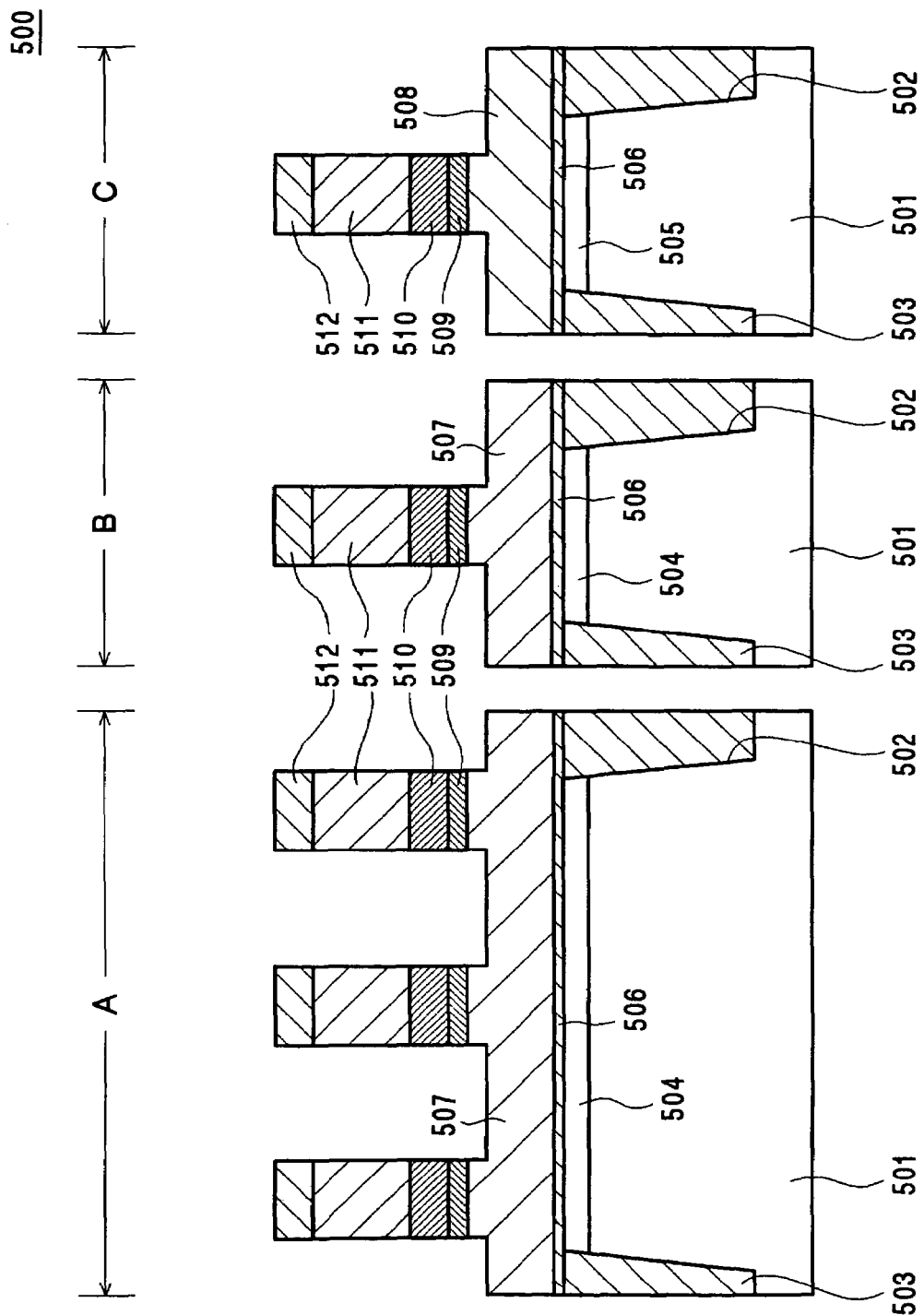
FIG. 14 is a partial cross-sectional view showing one process (etching a tungsten (W) layer 510, a tungsten nitride (WN) layer 509 and surfaces of the polycrystalline silicon layer 507 and 508) of the semiconductor device manufacturing method according to the preferred embodiment of the present invention.

Next, as shown in FIG. 14, the W layer 510 and the WN layer 509 are etched by using mixed gas consisting of CF4, Cl2, O2 and N2 and using the mask patterns 514 as masks, with an ECR (Electron Cyclotron Resonance) type plasma etching apparatus. Subsequently, the surfaces of the N-type polycrystalline silicon layer 507 and the P-type polycrystalline silicon layer 508 are etched away by about 20 nm. At this time, it is not necessary to exactly control the etching end-point, and therefore the etching end-point may be controlled, for example, by performing etching for a predetermined time period.

Figure 15:
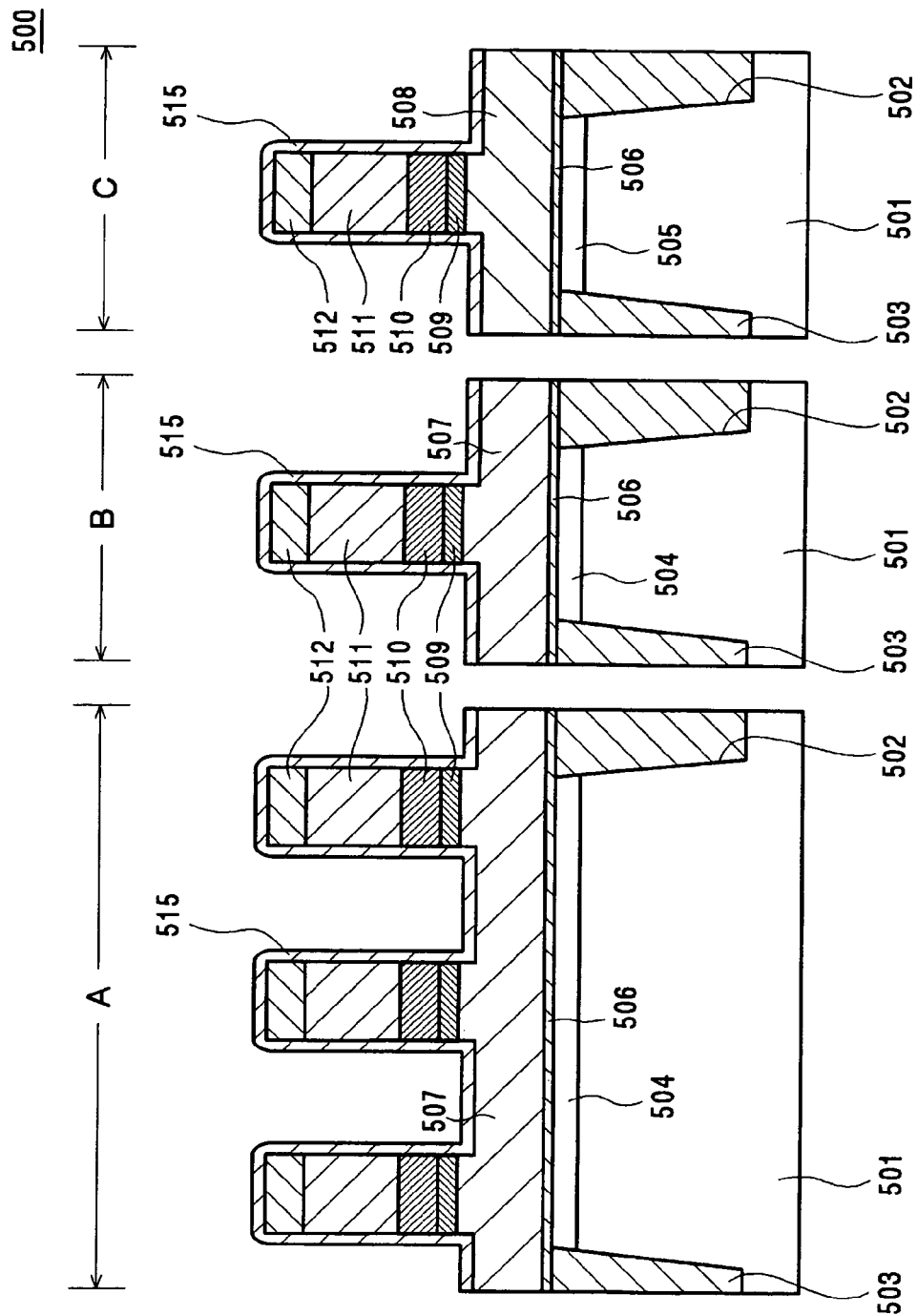
FIG. 15 is a partial cross-sectional view showing one process (forming of a silicon nitride layer 515) of the semiconductor device manufacturing method according to the preferred embodiment of the present invention.

Subsequently, as shown in FIG. 15, a silicon nitride layer 515 with a thickness of about 13 nm is deposited over the entire surface by an LPCVD (Low Pressure Chemical Vapor Deposition) method. Thus, the side surfaces of the WN layer 509 and the W layer 510 which have been exposed by etching become covered with the silicon nitride layer 515. The silicon nitride layer 515 is used for preventing the dispersion of the tungsten (W) from the WN layer 509 and the W layer 510 during subsequent heat treatment, thus preventing the increase of junction leakage.

Figure 16:
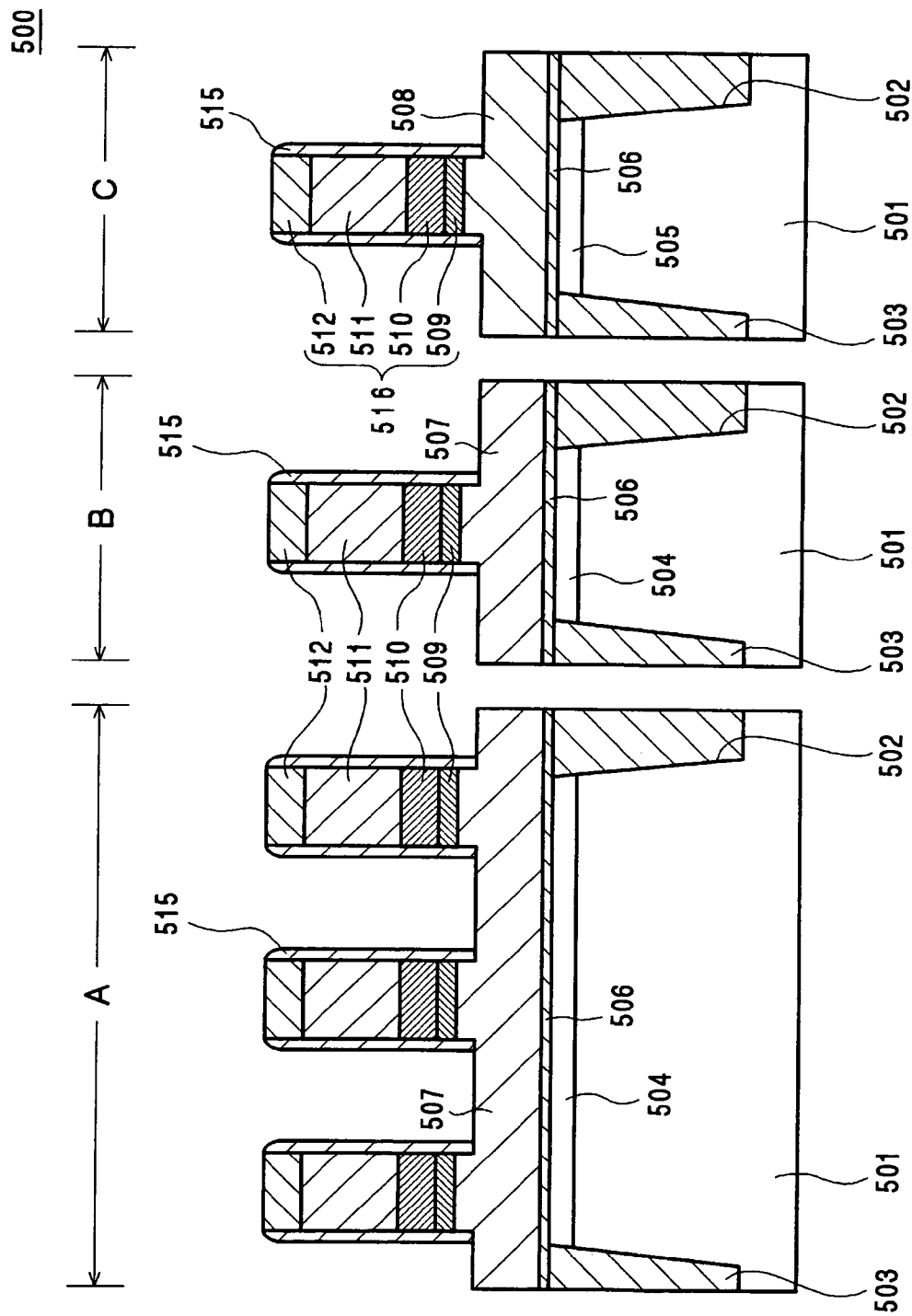
FIG. 16 is a partial cross-sectional view showing one process (etching back the silicon nitride layer 515) of the semiconductor device manufacturing method according to the preferred embodiment of the present invention.

Subsequently, as shown in FIG. 16, the silicon nitride layer 515 is etched back using mixed gas consisting of CF4 and Ar with an ECR-type plasma etching apparatus. Thus, the silicon nitride layer 515 on the N-type polycrystalline silicon layer 507 and the P-type polycrystalline silicon layer 508, and the silicon nitride layer 515 formed on the upper surface of the silicon oxide layer 512 are removed. During this process, the detection of the etching end-point is performed by monitoring 386 nm-light generation caused by CN molecules. Namely, the time point the generated light intensity attenuates corresponds to the time point the N-type polycrystalline silicon layer 507 and the P-type polycrystalline silicon layer 508 are exposed, and therefore the etching may be stopped at this time point.

Consequently, the laminated layers consisting of the WN layer 509, the W layer 510, the silicon nitride layer 511 and the silicon oxide layer 512, which are covered with the silicon nitride layer 515 at their side walls, form mask patterns 516 to be used for etching of the remaining portions of the N-type polycrystalline silicon layer 507 and the P-type polycrystalline silicon layer 508. At this time, the mask patterns 516 form line-and-space patterns having a width of about 110 nm and an interval of about 110 nm in the region A.

When the N-type polycrystalline silicon layer and the P-type polycrystalline silicon layer are concurrently etched to form N-type gates and P-type gates, it is preferable to apply etching thereto under an etching condition which causes the N-type polycrystalline silicon layer and the P-type polycrystalline silicon layer to be etched at an equivalent etching rate. On the other hand, if they are etched using etching gases C12 or HBr which are used for conventional gate-electrode processing (etching of single-conductivity type polycrystalline silicon layers), this will cause a significant etching-rate difference between the N-type polycrystalline silicon layer and the P-type polycrystalline silicon layer, thus causing differences in the gate-electrode shapes after the processing. In order to reduce such shape differences after processing, addition of fluoro-carbon-based gas such as CF4 is effective. However, etching using fluoro-carbon-based gas has the drawback of degradation of the selectivity with respect to the underlying gate oxide layer. Therefore, the polycrystalline silicon layers are processed by two-stage etching as follows. That is, at first, the polycrystalline silicon layers are etched using gas containing fluoro-carbon-based gas, until just before the polycrystalline silicon layers are completely removed (a first stage). Subsequently, the etching is temporally stopped and then the remaining polycrystalline silicon layers are removed by etching using etching gas containing no fluoro-carbon-based gas with higher selectivity with respect to the gate oxide layer (a second stage).

In this case, if the amount of etching is insufficient at the first stage, then the amount of etching at the second stage will be increased by the amount of the insufficiency, thus causing a large shape difference between the N gates and the P gates. On the contrary, if the amount of etching is excessive at the first stage, this will cause damage of the gate oxide layer and the silicon substrate. Consequently, it is necessary to accurately stop the first-stage etching just before the polycrystalline silicon layers are completely removed. In the present embodiment, the detection of the etching end-point is performed using the aforementioned semiconductor device manufacturing apparatus 100 shown in FIGS. 6 to 10, during the first-stage etching.

Figure 17:
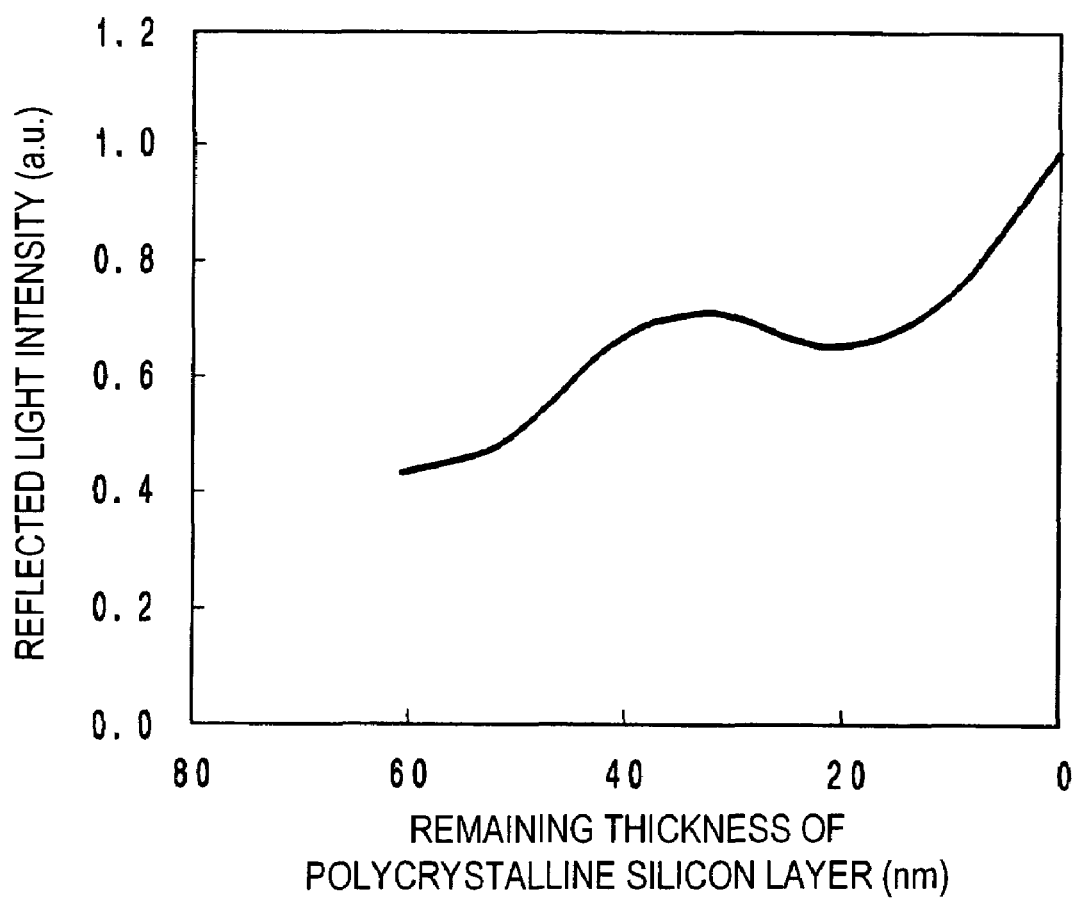
FIG. 17 is a graph showing the relationship between the remaining thickness of a polycrystalline silicon layer and the intensity of reflected light of the polarized light component perpendicular to line-and-space patterns.

FIG. 17 shows the result of measurements of the change in the intensity (a.u.) of the polarized light component perpendicular to line-and-space patterns, out of polarized light components of reflected light, with respect to the remaining thickness (nm) of a polycrystalline silicon layer, wherein the result was obtained by preparing a sample having the same structure as the polycrystalline silicon layer 507 and mask patterns 516 formed in the memory cell region A, that is, line-and-space patterns consisting of laminated layers consisting of a WN layer, a W layer, a silicon nitride layer and a silicon oxide layer with a width of about 110 nm and an interval of about 110 nm and subsequently etching the underlying poly crystalline silicon layer using the line-and-space patterns as masks while applying light to the sample. From the result of measurements of FIG. 17, it can be seen that the reflected light intensity transition point from decrease to increase corresponds to a remaining layer thickness of 20 nm. The relationship between the remaining layer thickness and the reflected light intensity as shown in FIG. 17 is stored in advance in the end-point detecting unit 307 of the semiconductor device manufacturing apparatus 100 in FIGS. 6 to 10.

Figure 18:
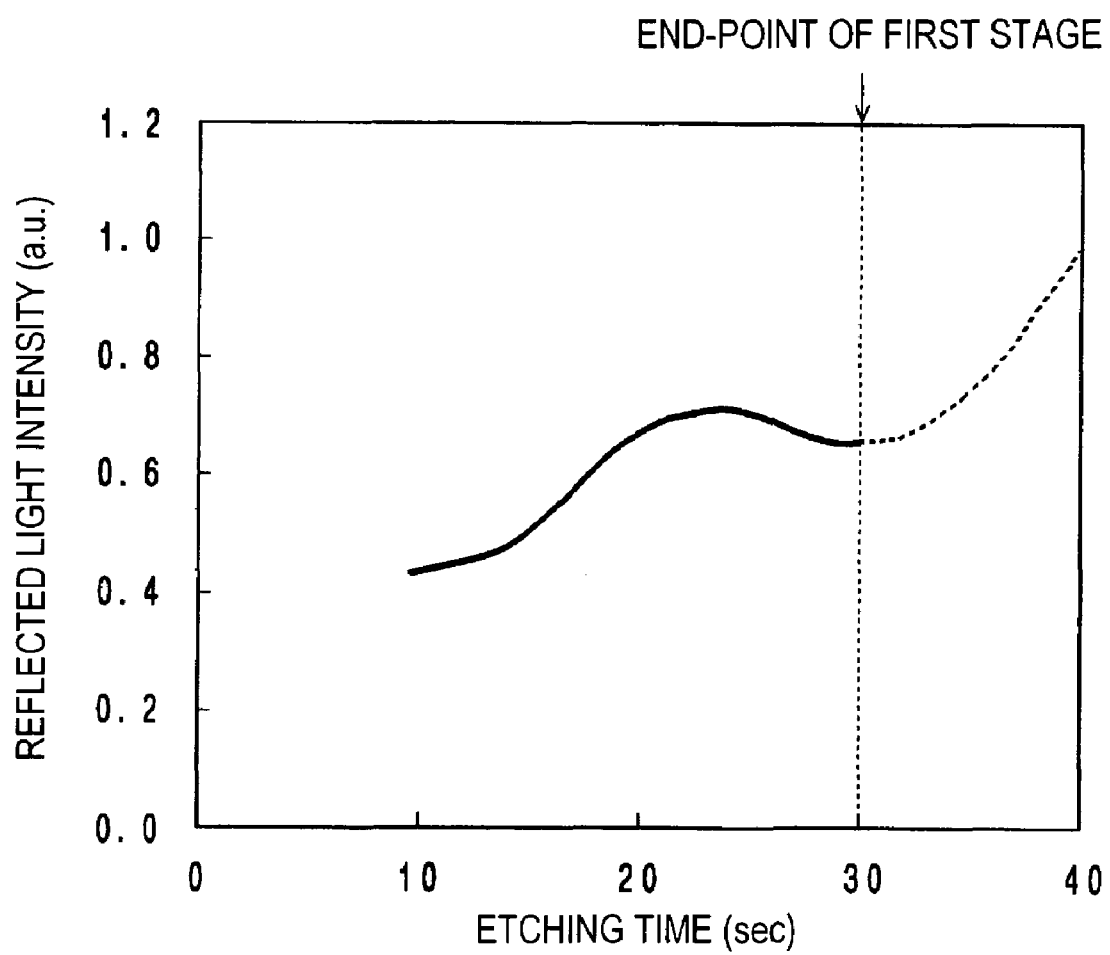
FIG. 18 is a graph showing the relationship between the etching time and the intensity of reflected light of the polarized light component perpendicular to line-and-space patterns.

That is, a semiconductor wafer 500 as shown in FIG. 16 is mounted on the stage 201 of the plasma processing unit 200 of the semiconductor device manufacturing apparatus 100 in FIGS. 6 to 10 and the apparatus 100 or the wafer 500 is set such that the polarized light component perpendicular to the extending direction of the mask patterns 516 in the region A is incident on the spectroscope 305. Then, the N-type polycrystalline silicon layer 507 and the P-type polycrystalline silicon layer 508 are etched using mixed gas consisting of CF4, O2 and C12. FIG. 18 shows the relationship between the etching time and the reflected light intensity. The end-point detecting unit 307 of the semiconductor device manufacturing apparatus 100 sends control signals 307a to the plasma processing unit 200 to cause it to terminate the first-stage etching, at the time of the reflected light intensity transition from decrease to increase, on the basis of the result of measurements shown in FIG. 17.

Figure 19:
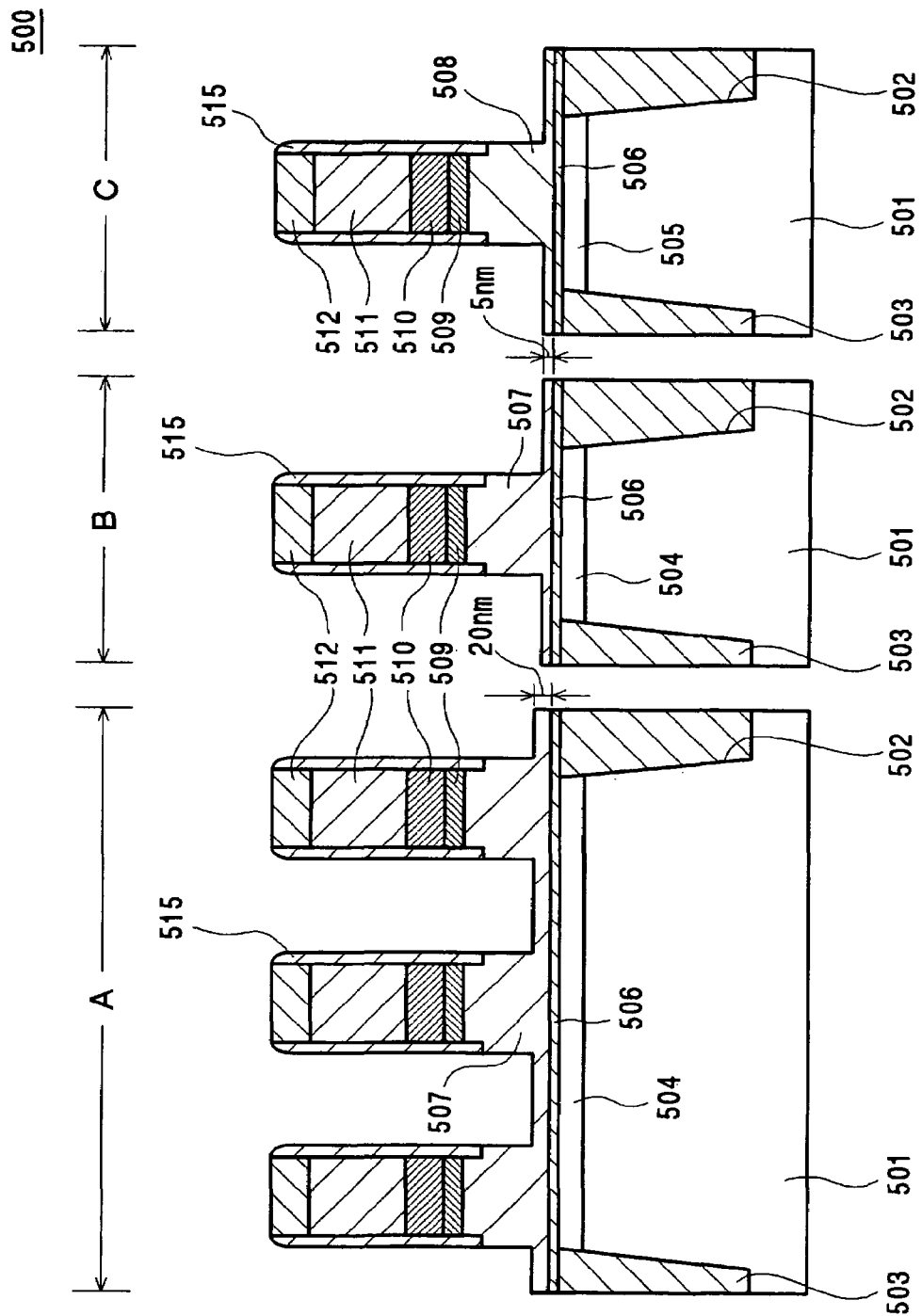
FIG. 19 is a partial cross-sectional view showing one process (etching the polycrystalline silicon layers 507 and 508 (a first-stage)) of the semiconductor device manufacturing method according to the preferred embodiment of the present invention.

FIG. 19 shows a cross-sectional view of the semiconductor wafer 500 at the completion of the first-stage etching. The remaining thickness of the N-type polycrystalline silicon layer 507 in the region A is about 20 nm and the remaining thicknesses of the N-type polycrystalline silicon layer 507 and the P-type polycrystalline silicon layer 508 in the regions B and C are about 5 nm, and thus the etching has been terminated just before the gate oxide layer 506 is exposed. The difference between the remaining thickness of the polycrystalline silicon layer 507 in the region A (about 20 nm) and the remaining thicknesses of the polycrystalline silicon layers 507 and 508 in the regions B and C (about 5 nm) is caused by the fact that the regions B and C have gate electrode densities than that of the region A, and therefore etching proceeds faster in the regions B and C.

Figure 20:
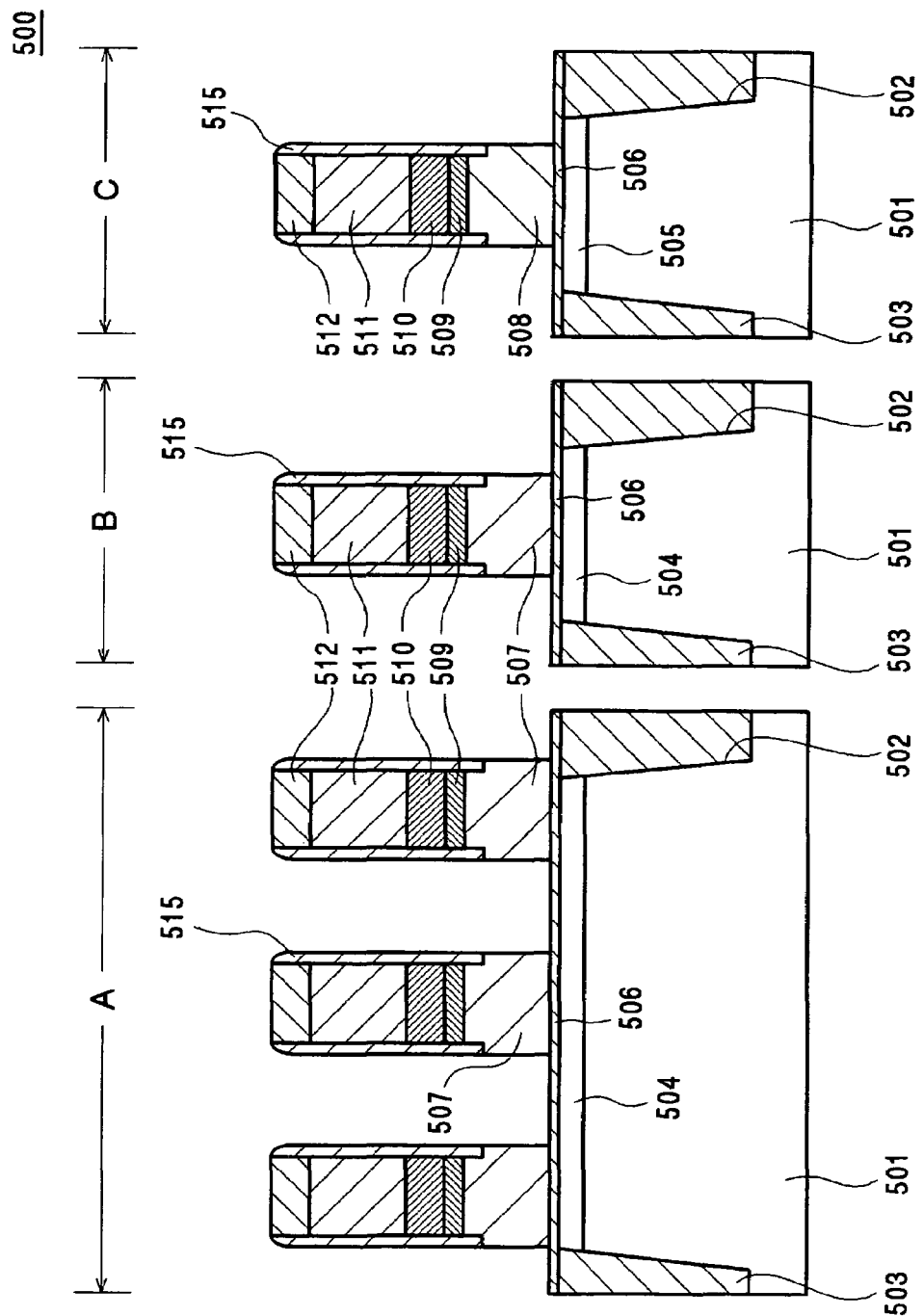
FIG. 20 is a partial cross-sectional view showing one process (etching the polycrystalline silicon layers 507 and 508 (a second-stage)) of the semiconductor device manufacturing method according to the preferred embodiment of the present invention.

Next, as shown in FIG. 20, the remaining N-type polycrystalline silicon layer 507 and the remaining P-type polycrystalline silicon layer 508 are removed by etching using mixed gas consisting of HBr and O2 as a second-stage etching. At this step, 251-nm light generation caused by silicon molecules is monitored, the time point that the light generation attenuates is detected as the etching end-point and then over etching is performed for 10 seconds from then on. As a result, the upper surface of the gate oxide layer 506 is completely exposed. The etching using mixed gas consisting of HBr and O2 offers excellent selectivity with respect to the underlying gate oxide layer 506, thus preventing the gate oxide layer 506 from being etched. According to the present embodiment, since the polycrystalline silicon layers 507 and 508 to be etched at the second stage are significantly thin in the remaining layer thicknesses, even the etching using mixed gas consisting of HBr and O2 causes little etching profile difference between the N-type polycrystalline silicon layer 507 and the P-type polycrystalline silicon layer 508.

Figure 21:
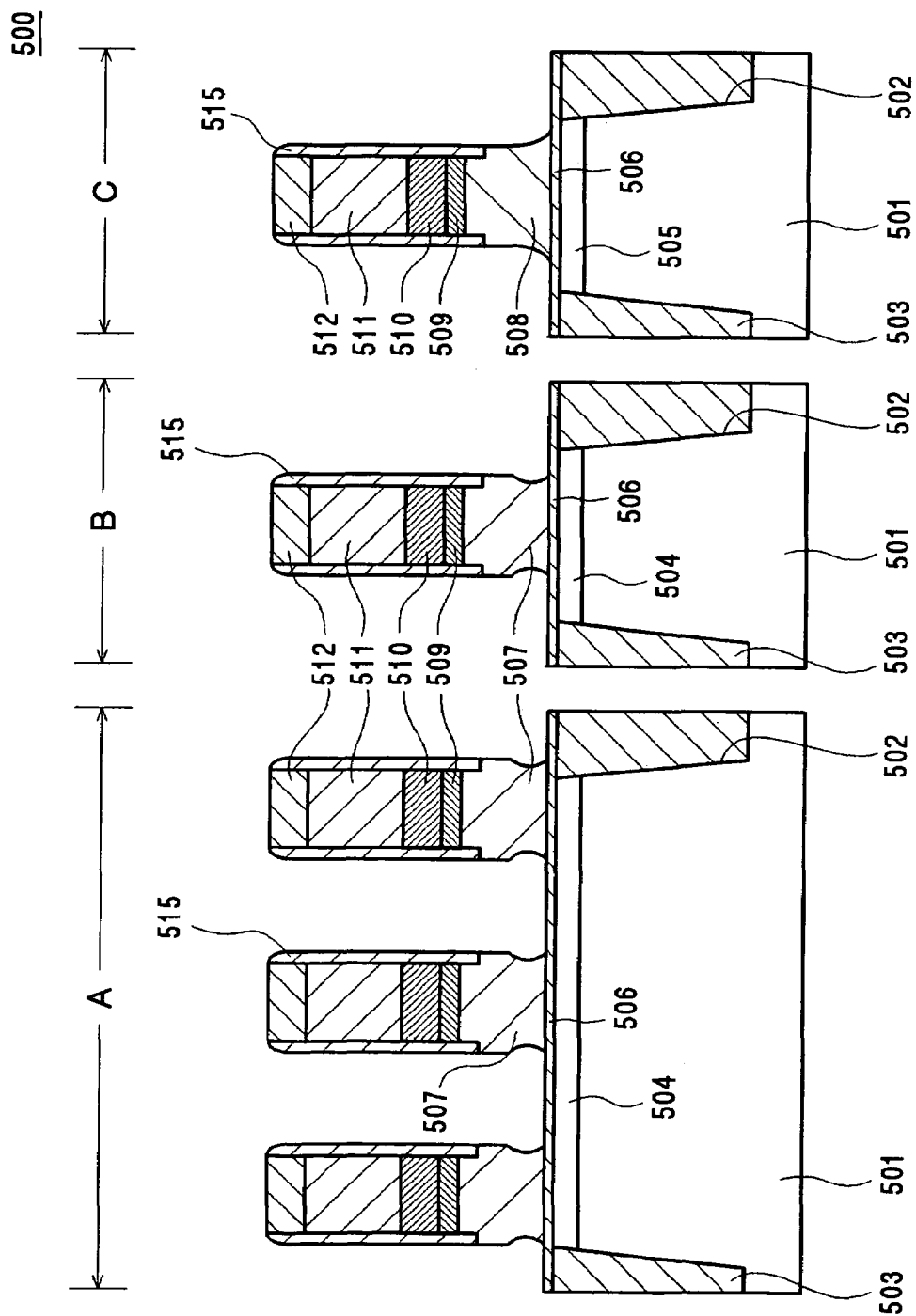
FIG. 21 is a partial cross-sectional view showing the shape when the first-stage etching is insufficient.
Figure 22:
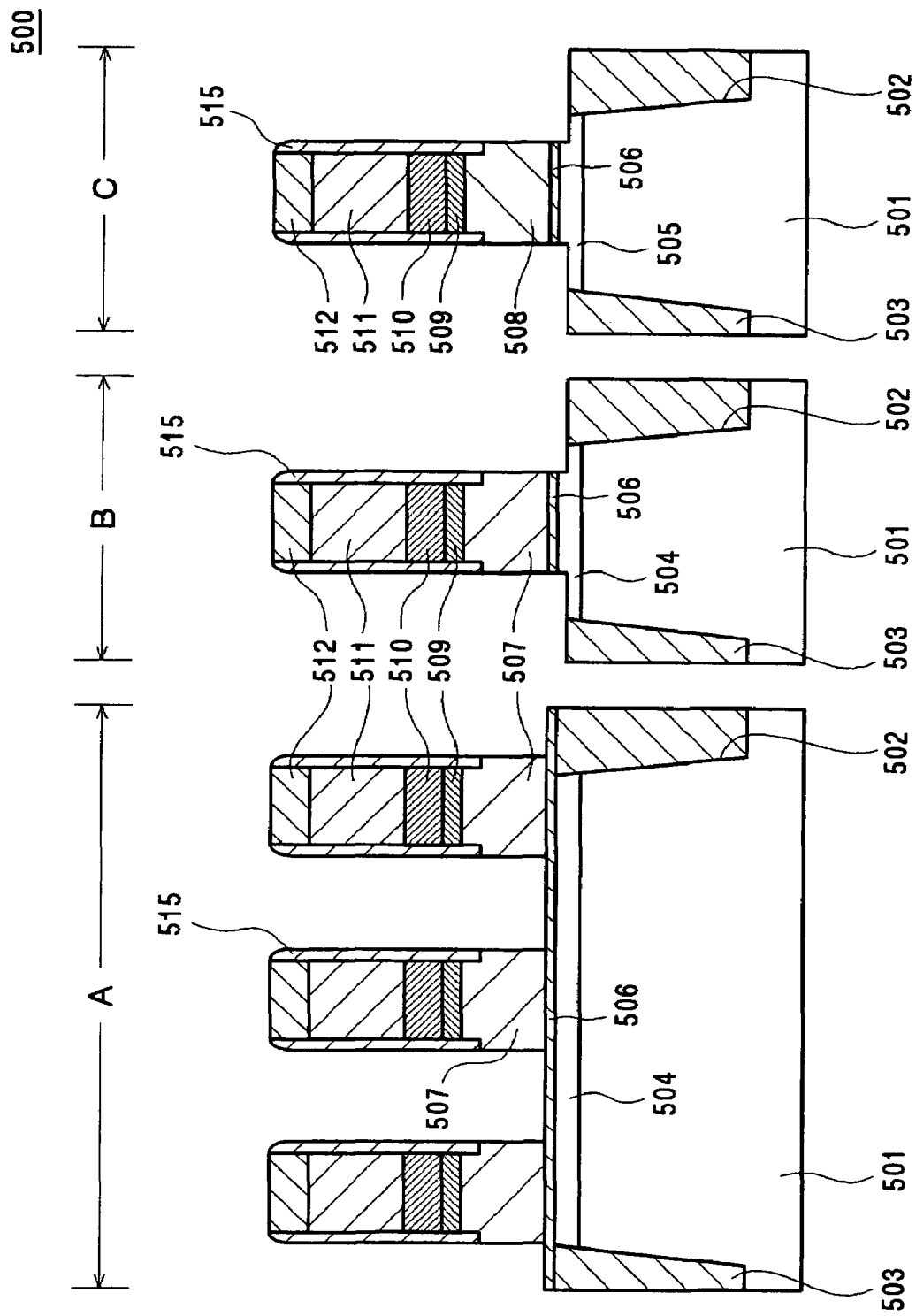
FIG. 22 is a partial cross-sectional view showing the shape when the first-stage etching is excessive.

FIG. 21 and FIG. 22 show states after the completion of the second-stage etching in cases where the determination of the end-point of the first-stage etching was inaccurate, for comparison with the present embodiment. FIG. 21 shows a case where the first-stage etching is insufficient (the polycrystalline silicon layers 507 and 508 have excessive remaining layer thicknesses) and FIG. 22 shows a case where the first-stage etching is excessive (the polycrystalline silicon layers 507 and 508 have insufficient remaining layer thicknesses).

As shown in FIG. 21, if the first-stage etching is insufficient, then the second-stage etching must be elongated, which causes N-type gates to have side-etched shapes while causing P-type gates to have tapered shapes, thus causing gate shape differences.

On the other hand, as shown in FIG. 22, if the first-stage etching is excessive, then the first-stage etching will excessively proceed in the peripheral-circuit regions B and C having lower gate electrode densities, thus resulting in the elimination of the gate oxide layer 506 and etching of the silicon substrate 501.

On the contrary, with the present embodiment, the polycrystalline silicon layers are etched away while the intensity of the polarized light component perpendicular to the mask patterns 516 is monitored, thereby enabling easy and accurate determination of the remaining layer thickness. This enables terminating the first-stage etching just before the gate oxide layer 506 is exposed, and consequently enables provision of gate electrode structures having little shape difference between N-type gates and P-type gates without causing damage to the silicon oxide layer 506 and the silicon substrate 501, as shown in FIG. 19.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, while in the aforementioned embodiment there has been described the case of applying the present invention to patterning of gate electrodes, the application of the present invention is not limited thereto.

Further, while in the aforementioned embodiment a magnetron-RIE type plasma etching apparatus is used for etching of the silicon oxide layer and the silicon nitride layer and an ECR type plasma etching apparatus is used for etching of the W layer, the WN layer and the polycrystalline silicon layer, it is possible to employ other types of plasma etching apparatuses.

Further, while in the aforementioned embodiment the metal layer and the electrically-conductive metal compound layer included in the mask patterns are the W layer and the WN layer, it is also possible to offer the same effects by employing a single layer or laminated layers consisting of a metal layer made of other materials such as an Al layer or a Ti layer, or a metal silicide layer such as a tungsten silicide layer or the like. However, in the case where it is necessary to apply heat treatment after patterning, it is preferable to select a W layer and a W-compound layer which are resistant to heat treatment.

What is claimed is:

1. A semiconductor device manufacturing method comprising the steps of:
   a first step for forming a polycrystalline silicon layer on a semiconductor substrate;
   a second step for forming an electrically-conductive layer containing at least one of a metal and an electrically-conductive metal compound on the polycrystalline silicon layer;
   a third step for forming a mask layer comprising plural patterns extending in a predetermined direction on the electrically-conductive layer;
   a fourth step for patterning the electrically-conductive layer using the mask layer;
   a fifth step for etching the polycrystalline silicon layer by plasma etching using a first etching gas and using the mask layer such that the polycrystalline silicon layer remains with a predetermined thickness; and
   a sixth step for etching away the polycrystalline silicon layer with the predetermined thickness by plasma etching using a second etching gas different from the first etching gas and using the mask layer,
   wherein, during said fifth step, a main surface of said semiconductor substrate is irradiated with inspection light and an end-point of said plasma etching using said first etching gas is determined on the basis of intensity of a polarized light component perpendicular to the predetermined direction contained in reflected light of said inspection light which is reflected from said main surface of said semiconductor substrate.

2. The semiconductor device manufacturing method as claimed in claim 1, wherein said electrically-conductive layer contains tungsten (W).

3. The semiconductor device manufacturing method as claimed in claim 1, further comprising a step for forming a silicon oxide layer on said semiconductor substrate prior to said first step and the surface of said silicon oxide layer is exposed by said sixth step.

4. The semiconductor device manufacturing method as claimed in claim 2, further comprising a step for forming a silicon oxide layer on said semiconductor substrate prior to said first step and the surface of said silicon oxide layer is exposed by said sixth step.

5. The semiconductor device manufacturing method as claimed in claim 1, wherein said first etching gas contains fluoro carbon and said second etching gas does not contain fluoro carbon.

6. The semiconductor device manufacturing method as claimed in claim 2, wherein said first etching gas contains fluoro carbon and said second etching gas does not contain fluoro carbon.

7. The semiconductor device manufacturing method as claimed in claim 3, wherein said first etching gas contains fluoro carbon and said second etching gas does not contain fluoro carbon.

8. The semiconductor device manufacturing method as claimed in claim 4, wherein said first etching gas contains fluoro carbon and said second etching gas does not contain fluoro carbon.

9. The semiconductor device manufacturing method as claimed in claim 5, wherein said polycrystalline silicon layer contains an N-type portion and a P-type portion.

10. The semiconductor device manufacturing method as claimed in claim 6, wherein said polycrystalline silicon layer contains an N-type portion and a P-type portion.

11. The semiconductor device manufacturing method as claimed in claim 7, wherein said polycrystalline silicon layer contains an N-type portion and a P-type portion.

12. The semiconductor device manufacturing method as claimed in claim 8, wherein said polycrystalline silicon layer contains an N-type portion and a P-type portion.

* * * * *